United States Patent
Yang et al.

(10) Patent No.: US 10,660,217 B2
(45) Date of Patent: May 19, 2020

(54) METHODS OF FAST FABRICATION OF SINGLE AND MULTILAYER CIRCUIT WITH HIGHLY CONDUCTIVE INTERCONNECTIONS WITHOUT DRILLING

(71) Applicants: Jun Yang, London (CA); Tengyuan Zhang, London (CA); Qiuquan Guo, London (CA)

(72) Inventors: Jun Yang, London (CA); Tengyuan Zhang, London (CA); Qiuquan Guo, London (CA)

(73) Assignee: Jun Yang, London, ON (CA)

( * ) Notice: Subject to any disclaimer, the term of this patent is extended or adjusted under 35 U.S.C. 154(b) by 0 days.

(21) Appl. No.: 15/993,351

(22) Filed: May 30, 2018

(65) Prior Publication Data
US 2018/0352661 A1    Dec. 6, 2018

Related U.S. Application Data

(60) Provisional application No. 62/512,350, filed on May 30, 2017.

(51) Int. Cl.
*C23C 18/16* (2006.01)
*C23C 18/40* (2006.01)
(Continued)

(52) U.S. Cl.
CPC ........... *H05K 3/425* (2013.01); *C23C 18/165* (2013.01); *C23C 18/166* (2013.01);
(Continued)

(58) Field of Classification Search
CPC . C23C 18/1644; C23C 18/165; C23C 18/166; C23C 18/1692; C23C 18/2086;
(Continued)

(56) References Cited

U.S. PATENT DOCUMENTS 4,099,974 A * 7/1978 Morishita ............. C23C 18/405
                                                  106/1.23
4,443,257 A * 4/1984 Tomaiuolo ............. C23C 18/40
                                                  106/1.23
(Continued)

OTHER PUBLICATIONS

Liu, A facile way of fabricating a flexible and conducive cotton fabric, Jan. 2016, Journal of Materials Chemistry C, vol. 4, p. 1320-1325 (Year: 2016).*
(Continued)

*Primary Examiner* — Dah-Wei D. Yuan
*Assistant Examiner* — Nga Leung V Law
(74) *Attorney, Agent, or Firm* — Hill & Schumacher

(57) ABSTRACT

Provided herein is a method to printed electronics, and more particularly related to printed electronics on flexible, porous substrates. The method includes applying a coating compound comprising poly (4-vinylpyridine) (P4VP) and SU-8 dissolved in an organic alcohol solution to one or more surface of a flexible, porous substrate, curing the porous substrate at a temperature of at least 130° C. such that the porous substrate is coated with a layer of said coating compound, printing a jet of a transition metal salt catalyst solution onto one or more printing sides of the flexible, porous substrate to deposit a transition metal salt catalyst onto the one or more printing sides, and submerging the substrate in an electroless metal deposition solution to deposit the metal on the flexible, porous substrate, wherein the deposited metal induces the formation of one or more three-dimensional metal-fiber conductive structures within the flexible, porous substrate.

17 Claims, 27 Drawing Sheets

(51) Int. Cl.
| | |
|---|---|
| *C23C 18/30* | (2006.01) |
| *C23C 18/28* | (2006.01) |
| *C23C 18/20* | (2006.01) |
| *H05K 3/42* | (2006.01) |
| *H05K 1/03* | (2006.01) |
| *H05K 3/12* | (2006.01) |
| *H05K 1/09* | (2006.01) |
| *H05K 3/18* | (2006.01) |
| *H05K 3/38* | (2006.01) |
| *H05K 1/18* | (2006.01) |

(52) U.S. Cl.
CPC ...... *C23C 18/1644* (2013.01); *C23C 18/1692* (2013.01); *C23C 18/2086* (2013.01); *C23C 18/285* (2013.01); *C23C 18/30* (2013.01); *C23C 18/405* (2013.01); *H05K 1/0386* (2013.01); *H05K 1/0393* (2013.01); *H05K 1/092* (2013.01); *H05K 3/125* (2013.01); *H05K 3/181* (2013.01); *H05K 3/182* (2013.01); *H05K 3/422* (2013.01); *H05K 3/429* (2013.01); *H05K 1/189* (2013.01); *H05K 3/387* (2013.01); *H05K 2201/0116* (2013.01); *H05K 2201/0154* (2013.01); *H05K 2201/0281* (2013.01); *H05K 2201/10098* (2013.01); *H05K 2201/10106* (2013.01); *H05K 2203/013* (2013.01); *H05K 2203/072* (2013.01); *H05K 2203/0709* (2013.01); *H05K 2203/1361* (2013.01); *H05K 2203/166* (2013.01)

(58) Field of Classification Search
CPC ..... C23C 18/285; C23C 18/30; C23C 18/405; C23C 18/16
USPC ..... 427/97.9, 99.5, 304, 305, 306, 437, 438, 427/443.1
See application file for complete search history.

(56) References Cited

U.S. PATENT DOCUMENTS

| | | | |
|---|---|---|---|
| 2011/0205285 A1* | 8/2011 | Okubo | C09D 11/324 347/20 |
| 2012/0218512 A1* | 8/2012 | Archambeau | G02B 1/10 351/159.61 |
| 2014/0210884 A1* | 7/2014 | Rosario | B41J 2/04588 347/10 |
| 2016/0037651 A1* | 2/2016 | Uesugi | H05K 1/0284 428/172 |
| 2016/0163567 A1* | 6/2016 | Wei | H01L 21/4846 257/753 |

OTHER PUBLICATIONS

Hu, SU-8 induced strong bonding of polymer ligands to flexible substrates via in situ cross-linked reaction for improved surface metallization and fast fabrication of high-quality flexible circuits, Feb. 2016, Applied Materails & Interfaces, vol. 8, p. 4280-4286 (Year: 2016).*

* cited by examiner

METHODS OF FAST FABRICATION OF SINGLE AND MULTILAYER CIRCUIT WITH HIGHLY CONDUCTIVE INTERCONNECTIONS WITHOUT DRILLING

FIELD

This invention is related to printed electronics, and more particularly related to printed electronics on porous substrates.

BACKGROUND

Printed electronics (PE) technology harnesses the existing manufacturing capabilities of the graphics industry to produce circuitries cheaply and quickly, and has garnered remarkable attention in the last decade. This technology is transforming the electronics industry by replacing traditional costly methods of fabricating electronic components, devices or even systems. Increasingly, printed thin-film transistors, conductors, inductors and capacitors are being integrating with electronics devices to develop novel systems, such as thin-film energy harvesting/storage system, smart labels, radio frequency identification (RFID) tags and memory devices. A world full of flexible, wearable, even stretchable devices using printing technology is foreseeable in the near future.

Many demonstrations of paper electronics have been made recently; however, existing applications of paper electronics involve the use of plastic-covered paper substrates, photopaper lamination of a plastic film (electronics paper tickets) or the gluing of electronics components, or silicon chips onto a porous substrate. These substrates have better chemical and physical properties than regular cellulose paper, but are generally more than 10 times as expensive. Fabricating a highly conductive circuit on a porous substrate is challenging as the porous substrate typically has high roughness, and cellulose fiber forms a highly porous structure that tends to absorb functional materials (e.g. metal nanomaterials, carbon nanotubes) instead of leaving them on the surface. This prevents conductive materials in the ink from contacting each other, making it impossible to form a highly conductive layer even after sintering, which leads to relatively poor performance in paper-based electronics. Additionally, the capillary effect of the porous substrate also causes a significant loss of resolution when printing with solvent-based ink.

Furthermore, the thickness of the conductor is crucial to many electronics applications. For the same conductor, a thicker layer means a smaller sheet resistance, and thus the thickness usually determines the maximum current the circuits can handle. In the electronics industry, a standard printed circuit board with a 35 μm thick copper layer is adopted for most devices. IoT requires a large number of RF devices to communicate with each other and harvest wireless energy for power. Typically, if the working frequency is higher than 1 MHz, then we need to consider the skin effect, i.e. the antenna conductor has to reach a certain thickness for optimum performance. For example, a copper antenna operating at 13.56 MHz has a skin effect depth of 17.7 μm which means the thickness of the printed antenna has to be at least approximately 17.7 μm for best performance. However, direct printing of conductive materials via a roll-to-roll compatible digital printing process cannot reach this level, which greatly limits its application in both RF devices and regular printed circuits.

All of these various obstacles cause traditional printed electronics to suffer in performance and resolution. Thus, it is important to find a solution to these issues to fully utilize the low-cost, environmental-friendly properties of cellulose paper and other porous substrate for printed electronic technologies.

Electroless metal deposition (ELD), which relies on an autocatalytic redox reaction to deposit various metals on a catalyst-preloaded substrate, offers a low-cost yet convincing solution to the thickness issue. Printed circuits fabricated using ELD have been demonstrated on various substrates such as PET, PI, photopaper, and even yarns. The thickness of the deposited metal layer can be finely tuned by the deposition time, but new challenges concerning adhesion and diffusion appear when thickness is increased. Untreated flexible substrates struggle with capturing catalyst moieties due to lack of binding sites, and simple physical absorption cannot prevent peeling of the deposited metal, especially if the thickness of the deposited metal exceeds 5 μm.

For porous substrate like cellulose paper, the loosely deposited metal particles tend to migrate out of the printed edge, resulting in a severe loss of resolution. As deposition time increases to achieve a thicker metal layer, more and more traces in the circuit will form connections with one another and form short circuits. Surface modification techniques such as UV-oxygen plasma, surface silanization, polyelectrolyte multilayer (PEM), and polymer grafting have been reported to enhance the adhesion between the electroless deposited metal layer and substrate. However, most of these techniques are currently far away from being a scalable cost-effective production method, due to their complexity and/or environmental impact and harsh experimental requirements. Thus, there is a need to develop a simple, low-cost and efficient surface modification method for all kinds of porous substrates to fabricate high resolution thick copper (>20 um) paper-based electronics with strong metal-fiber bonding.

Poly (4-vinylpyridine) (P4VP) has been used for surface modification purposes to uptake silver ions due to its strong chelating ability with transitional metal ions. As a reactive monomer, 4-vinylpyridine has been used to modify substrates via in-situ polymerization triggered by UV and/or plasma. Such cross-linked molecules form covalent bonds with the pretreated substrate, achieving good adhesion. However, a low film production rate and high equipment demands make this method not cost-effective and unsuitable for coating cellulose paper. P4VP molecules can be directly coated onto the substrate by physical absorption, but the poor adhesion will result in serious delamination of the electroless deposited metal.

Generally, manufacturing highly conductive circuits in a short time period using electroless metal deposition remains a challenge. The electroless metal deposition requires a relatively long time to make the circuit highly conductive because metal growth always happens on the surface for traditional methods. Meanwhile, it is impossible to manufacture multilayer circuits at one time without a drill. Such obstacles limit the application of electroless metal deposition in the manufacturing of printed electronics, especially for a roll-to-roll process.

SUMMARY

The present disclosure provides a method of fabricating metal-fiber conductive structures on a flexible, porous substrate, the method comprising the steps of:

(i) applying a coating compound comprising poly (4-vinylpyridine) (P4VP) and SU-8 dissolved in an organic alcohol solution to one or more surface of the flexible, porous substrate;

(ii) curing the porous substrate at a temperature of at least 130° C. such that the porous substrate is coated with a layer of said coating compound;

(iii) printing a jet of a transition metal salt catalyst solution onto one or more printing sides of the flexible, porous substrate to deposit a transition metal salt catalyst onto the one or more printing sides;

(iv) submerging the substrate in an electroless metal deposition solution to deposit the metal on the flexible, porous substrate, wherein the deposited metal induces the formation of one or more three-dimensional metal-fiber conductive structures within the flexible, porous substrate.

The step of curing the porous substrate may take place in air.

An inkjet printer may be used to print the jet of the transition metal salt catalyst solution onto one or more of the printing sides to deposit the transition metal salt catalyst onto the one or more printing sides.

The one or more printing parameters of said inkjet printer are set to achieve a pre-determined penetration depth of the transition metal salt catalyst solution into the porous substrate.

The one or more printing parameters of the inkjet printer for printing a jet of transition metal salt catalyst solution may be adjusted to activate a three-dimensional metal salt catalyst-loaded volume at a pre-specified depth below the surface of the porous substrate; and, wherein a jetting waveform is used to control the volume and velocity of a plurality of individual droplets within the jet of transition metal salt catalyst solution.

The one or more printing parameters may include inkjet droplet spacing, meniscus vacuum, printhead temperature, printhead angle and jetting voltage The jet of transition metal salt catalyst solution printed from the inkjet printer may have a droplet spacing in a range from 25 μm to 50 μm.

The porous substrate may be a substrate comprising cellulose paper, porous polyimide film, porous polyethylene terephthalate film, and textile.

The coating compound may be applied to the porous substrate by dip-coating said porous substrate in a solution of the coating compound.

The concentration of SU-8 in a solution of the coating compound may be in a range from about 2.5 wt % to about 5 wt %.

The concentration of P4VP in a solution of the coating compound may be in a range from 2.5 wt % to about wt 5%.

The solution of the coating compound may further comprise about 0.2 to about 1.5 mg/mL of polyvinylpyrrolidone (PVP) wherein the polyvinylpyrrolidone enhances the ability of the coating compound to capture nanoparticles of the transition metal salt catalyst.

The transition metal salt catalyst in the transition metal salt catalyst solution is one of silver nitrate, palladium chloride and tin chloride.

The concentration of transition metal salt in the transition metal salt catalyst solution may be in a range from 10 mM to 50 mM.

The present disclosure provides a method for preparing a transition metal salt catalyst solution containing silver nitrate, the method comprising the steps of:

i) mixing a glycerol-water solution of anhydrous glycerol and distilled water at a volume ratio of 3:2;

ii) adding silver nitrate into the glycerol-water solution to form a catalyst solution;

iii) mixing the catalyst solution in a vortex mixer for 4 minutes to form a silver slat solution containing 60 mg/mL of dissolved silver; and iv) degassing the silver salt solution in a vacuum chamber to remove dissolved gases and bubbles.

The electroless metal deposition solution may be a solution comprising 14 g/L of $CuSO_4.5H_2O$, 12 g/L of sodium hydroxide, 16 g/L of potassium sodium tartrate, 20 g/L of EDTA-2Na, 26 mL/L of HCHO, 20 mg/L of 2,2'-dipyridyl, and 10 mg/L potassium ferrocyanide.

The present disclosure provides an inkjet printer for carrying out the printing a jet of a transition metal salt catalyst solution, wherein the inkjet printer comprises:

a mounted cartridge for loading and storing the transition metal salt catalyst solution during the printing process, and a piezo-electric drop-on-demand inkjet printhead for depositing the transition metal salt catalyst solution.

The printing a jet of a transition metal-salt catalyst solution onto one or more sides of the coated substrate using an inkjet printer involves printing a jet of a transition metal-salt catalyst solution on both side of the coated substrate.

The present disclosure provides a method of fabricating multilayer metal-fiber circuits comprising a plurality of via holes on porous substrates, the method comprising the steps of:

i) applying a coating compound comprising poly (4-vinylpyridine) (P4VP) and SU-8 dissolved in an organic alcohol solution to one print surface on each of a plurality of porous substrates;

ii) curing the plurality of porous substrates in heated air;

iii) printing a jet of a transition metal salt catalyst solution using an inkjet printer onto the print surface of each of the plurality of porous substrates to deposit a transition metal salt catalyst onto the print surface;

iv) submerging each of the plurality of porous substrates in an electroless metal deposition solution to deposit the metal on the porous substrate, wherein the deposited metal induces the formation of one or more three-dimensional metal-fiber conductive structures within the porous substrate;

v) with predefined aligning holes, aligning the plurality of porous substrates such that the print surfaces of each of the plurality of porous substrates are facing the same direction; and vi) performing a staking process to form a plurality of layers of the plurality of porous substrates.

The step of printing a jet of a transition metal salt catalyst solution may further comprise the step of:

printing a jet of a transition metal salt catalyst solution at a plurality of interconnection between the plurality of layers, wherein a droplet spacing of less than 10 microns is utilized to ensure penetration of the transition metal salt catalyst solution penetrates through each of the plurality of layers of the plurality of porous substrates.

The one or more printing parameters of said inkjet printer may be set to achieve a pre-determined penetration depth of the transition metal salt catalyst solution into the plurality of porous substrates; and, wherein a jetting waveform is used to control the volume and velocity of a plurality of individual droplets within the jet of transition metal salt catalyst solution.

The one or more printing parameters may include inkjet droplet spacing, meniscus vacuum, printhead temperature, printhead angle and jetting voltage.

The jet of transition metal-salt catalyst solution printed from the inkjet printer may have a droplet space setting from about 2 μm to about 25 μm wherein this spacing is utilized for the printing of via holes.

The staking process may be one of heat staking, ultrasonic staking, cold forming, infrared staking and thermal punch.

A further understanding of the functional and advantageous aspects of the present disclosure can be realized by reference to the following detailed description and drawings.

BRIEF DESCRIPTION OF THE DRAWINGS

Embodiments will now be described, by way of example only, with reference to the drawings, in which:

FIG. 3A is a porous substrate after 0 seconds of ELCD.
FIG. 3B is a porous substrate after 15 seconds of ELCD.
FIG. 3C is a porous substrate after 15 minutes of ELCD.
FIG. 3D is a porous substrate after 30 minutes of ELCD.
FIG. 3E is a porous substrate after 1 hour of ELCD.
FIG. 3F is a porous substrate after 2 hours of ELCD.
FIG. 3G is a porous substrate after 3 hours of ELCD.
FIG. 3H is a porous substrate after 4 hours of ELCD.
FIG. 3I is a porous substrate after 5 hours of ELCD.

FIG. 9B is an optical image of the battery-free lighting device of FIG. 9A operating while it is deformed to contour a cylinder which it is fixed to.

DETAILED DESCRIPTION

Figure 1:
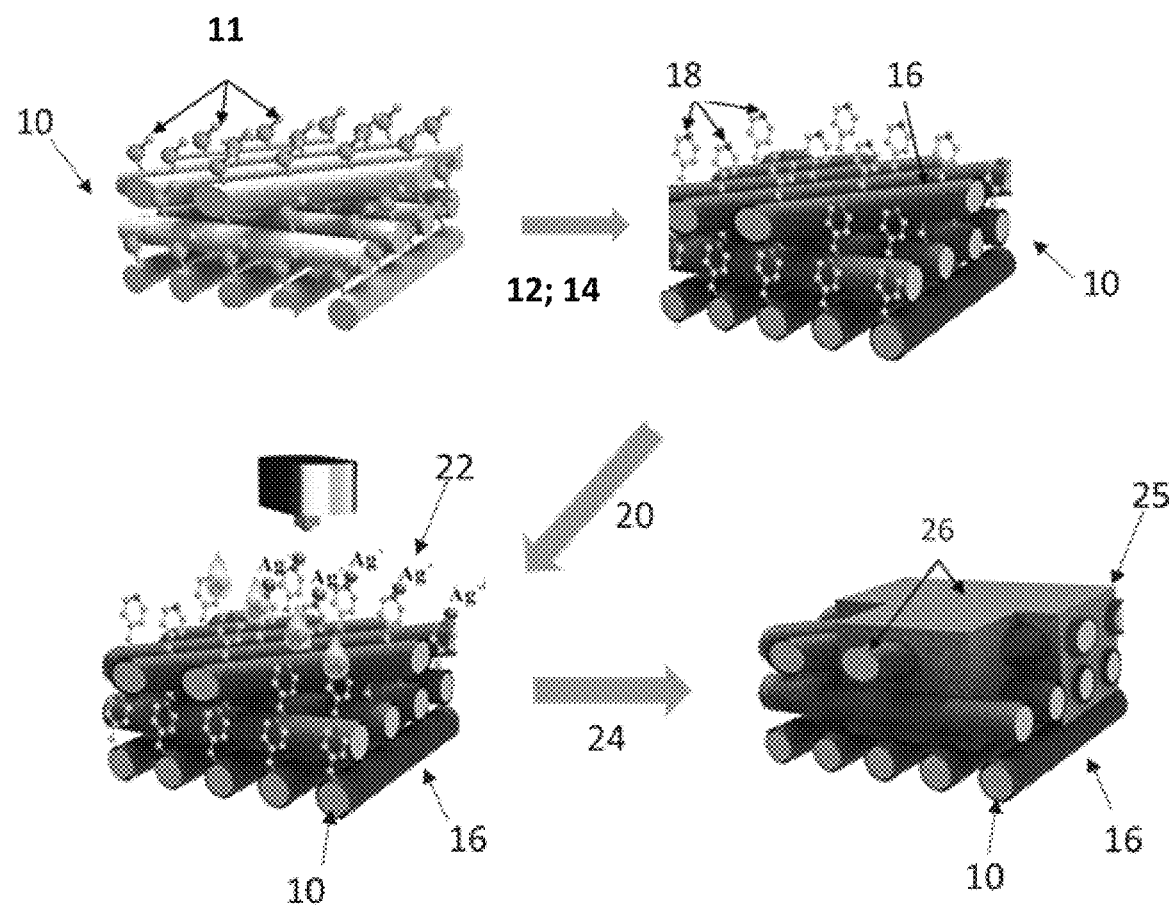
FIG. 1 is a diagram of the fabrication process for the forming of a copper-fiber conductive structure on cellulose paper.

Various embodiments and aspects of the disclosure will be described herein with reference to details discussed below. The following description and drawings are illustrative of the disclosure and are not to be construed as limiting the disclosure. The drawings are not to scale. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the terms "about" and "approximately" are meant to cover variations that may exist in the upper and lower limits of the ranges of values, such as variations in properties, parameters, and dimensions.

Disclosed herein is a method for fabricating metal-fiber conductive structures. One of ordinary skill in the art will interpret one metal-fiber conductive structure to be a single conductive pathway that does not fork into more than one pathways.

In the method for fabricating metal-fiber conductive structures on a porous substrate disclosed herein, SU-8 photoresist and Poly (4-vinylpyridine) (P4VP) are utilized as primary components of a coating compound. SU-8 is an epoxy-based, negative photoresist whereby the sections of this photoresist which are exposed to UV become crosslinked, while the remainder of the film remains soluble and can be washed away during development. SU-8 is introduced to the coating compound to act as a bridging agent between the P4VP and the material comprising the porous substrate. P4VP molecules are utilized for the current method as they display a strong uptake of catalyst metal ions used in the printing ink. P4VP molecules also demonstrate a strong behavior of crosslinking with epoxy. One skilled in the art will appreciate that the porous substrate of the present embodiment is a fibrous porous substrate comprised of fibers but that the method of the disclosure is applicable porous substrates and not limited to fibrous porous substrates.

An additional benefit of applying P4VP molecules to the current process is that the P4VP molecules display a strong chelating ability with transitional metal ions and as such, there is a variety of transition metal, catalyst metal ions which may be utilized in the loading of catalyst metal ions in the proposed method.

Coating of Porous Substrate

In an embodiment of the current invention, the porous substrate is a cellulose fiber substrate. Specifically, the cellulose fiber substrate of the present embodiment is cellulose paper. The cellulose fiber substrate may further comprise layers of porous polyimide film, porous polyethylene terephthalate film, and textile. The coating compound for application to the porous substrate is a solution of dissolved P4VP, SU-8 in a suitable organic alcohol solvent solution. In this embodiment, the organic alcohol solvent solution comprises a mixture of 1,4 dioxane and 2-propanol. Referring to the specific composition of the coating solution, the concentration of SU-8 in the coating solution is in the range of 2.5 wt. %-5 wt. % and the concentration of P4VP in the coating solution is 2.5 wt %-5 wt %. Highly reactive epoxy groups in the SU-8 tend to form strong bonds with cellulose fibers due to the many hydroxyl groups along the cellulose fiber surface, making it suitable for the current application. One skilled in the art will appreciate that the use of cellulose paper in the present embodiment is exemplary and the porous substrate of the present disclosure is in not way limited to a cellulose fiber substrate or to cellulose paper.

In the present embodiment of the coating solution applied to the cellulose paper, a small amount (0.2-1.5 mg/mL) of polyvinylpyrrolidone (PVP) is added to the coating solution to enhance its ability to be loaded with silver or other metallic nanoparticles. One of ordinary skill in the art will appreciate that the PVP that is added to the coating solution enhances the ability of the coating solution but that a coating solution without added PVP is able to produce a functional coating layer when applied to the porous substrate.

FIG. 1 shows the steps comprising the method for the fabrication of a high performance, highly conductive silver ion doped circuit on cellulose paper. In this method, the coating solution is applied to cellulose paper 10 via a dip-coating method 12, where the cellulose paper 10 contains hydroxy groups 11 along its surface, and is then dried in air at room temperature. The cellulose paper 10 with coating solution is then cured in air at 130° C., the curing process 14 involves covalent bonding between the cellulose paper 10 and SU-8 in the coating solution which forms a functional coating layer 16. In addition to the covalent bonding with the cellulose paper 10, the SU-8 in the coating solution forms covalent bonds with the pyridine groups of P4VP in the coating solution, leaving pyridine ligands 18 along the cellulose fiber to capture catalyst metal ions during the subsequent step.

In the same embodiment of the proposed method catalyst metal ions are loaded to selected areas of a sample of cellulose paper 10 coated with the functional coating layer 16 by inkjet printing 20 of printing ink containing catalyst metal ions. In a non-limiting example, the catalyst metal ions are silver ions 22, however the catalyst metal ion may be one or multiple transition metal ions such that the printing ink is a transition metal salt catalyst. In the same non-limiting example, the printing ink is a silver nitrate compound; however this printing ink could be a variety of suitable transition metal salt catalyst compounds. For example palladium chloride and tin chloride are also suitable transition metal salt catalyst compounds. In this embodiment of the method, when the silver nitrate compound contacts the cellulose paper 10, the lone electron pair in the nitrogen atom of the pyridine ligands 18 will attach to the silver ions 22 to form strong coordinate covalent bonds. Such chemical bonding is much stronger than simple physical absorption and helps keep the absorbed silver ions 22 adhered to the surface.

After deposition of the printing ink onto the coated cellulose paper, the entire coated cellulose paper is then put into a highly alkaline, electroless metal deposition (ELD) bath to induce metal growth. The ELD bath of the present embodiment is an electroless copper deposition (ELCD) bath 24 which comprises $CuSO_4.5H_2O$ (14 g/L), NaOH (12 g/L), potassium sodium tartrate (16 g/L), EDTA.2Na (20 g/L), HCHO (26 mL/L), 2,2'-dipyridyl (20 mg/L), and potassium ferrocyanide (10 mg/L).

The polyvinylpyrrolidone (PVP) in the present embodiment of the coating solution enhances the ability of the porous substrate to capture metal nanoparticles in the initial phase of the electroless copper deposition (ELCD) process. In the present embodiment the metal nanoparticles captured by the PVP include silver nanoparticles from the printing ink. The SU-8 photoresist contained in the functional coating layer 16 on the surface of the cellulose paper 10 also acts to protect the cellulose paper 10 during an longer duration ELCD process 24. Due to the ring-opening reaction of epoxide groups, the dominant bonding type will be carbon-oxygen bonds. Such bonds are highly resistant to alkali solutions, which allows the coating solution to withstand the highly alkaline ELCD solution of approximately 12 pH. Due to the porous structure of cellulose paper 10, the printing ink will penetrate to a certain depth, forming a 3D catalyst-loaded area. This specific penetration of the printing ink enables copper 25 to grow in a three-dimensional manner, generating copper at a much faster rate than traditional surface-only reactions. The method generates a highly conductive metal-fiber structure. In the present embodiment the metal-fiber structure is a copper-fiber structure 26 because copper is the metal used for electroless metal deposition. The copper-fiber structure 26 enhances the flexibility of the circuits and act as anchors to firmly hold onto the deposited copper 25, preventing any delamination and/or peeling of the deposited copper 25.

In an alternative embodiment of the disclosed method, the electroless metal deposition step uses gold, nickel or silver deposition instead of electroless copper deposition as used in the embodiment shown in FIG. 1.

Figure 2A:
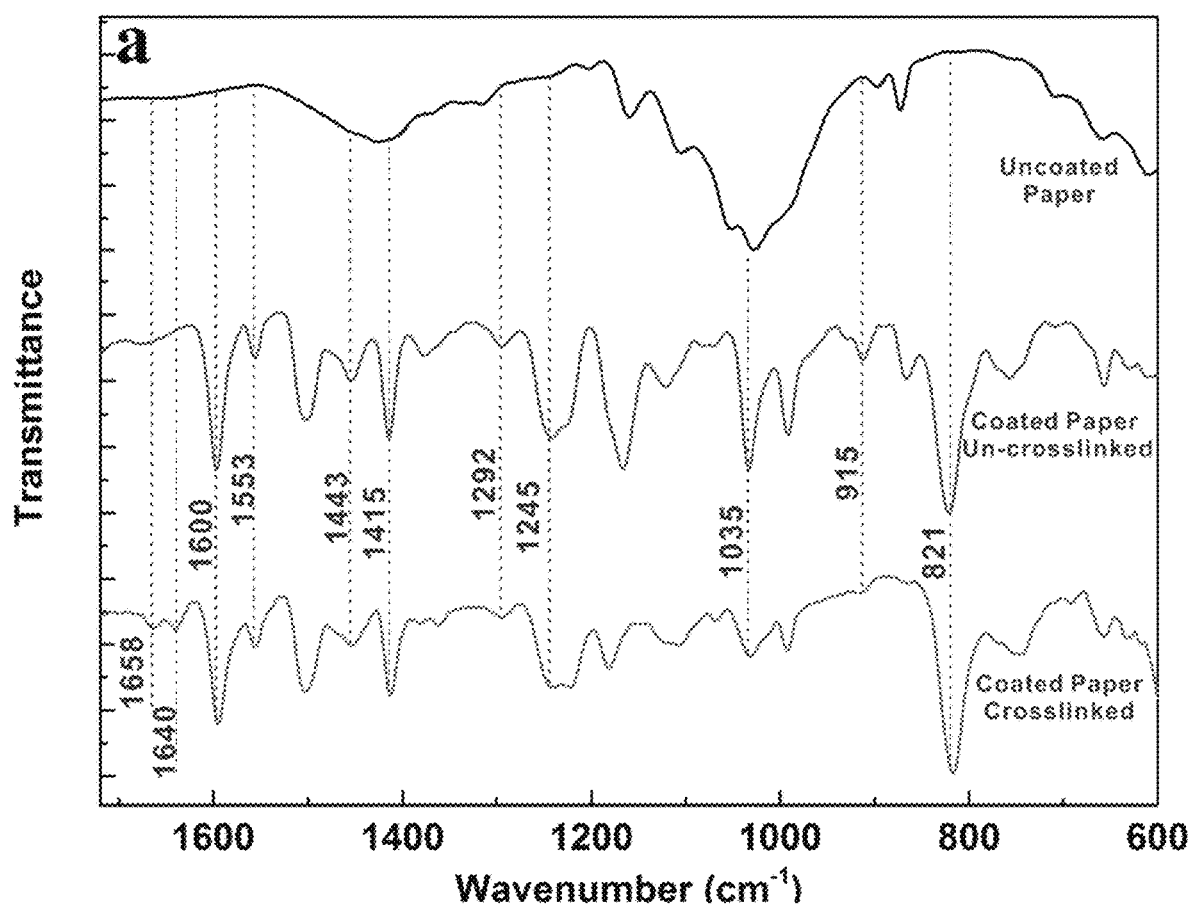
FIG. 2A is a graph of FT-IR spectra of uncoated cellulose paper, coated paper and coated paper after thermal treatment from top to bottom with marked characteristic peaks.
Figure 2B:
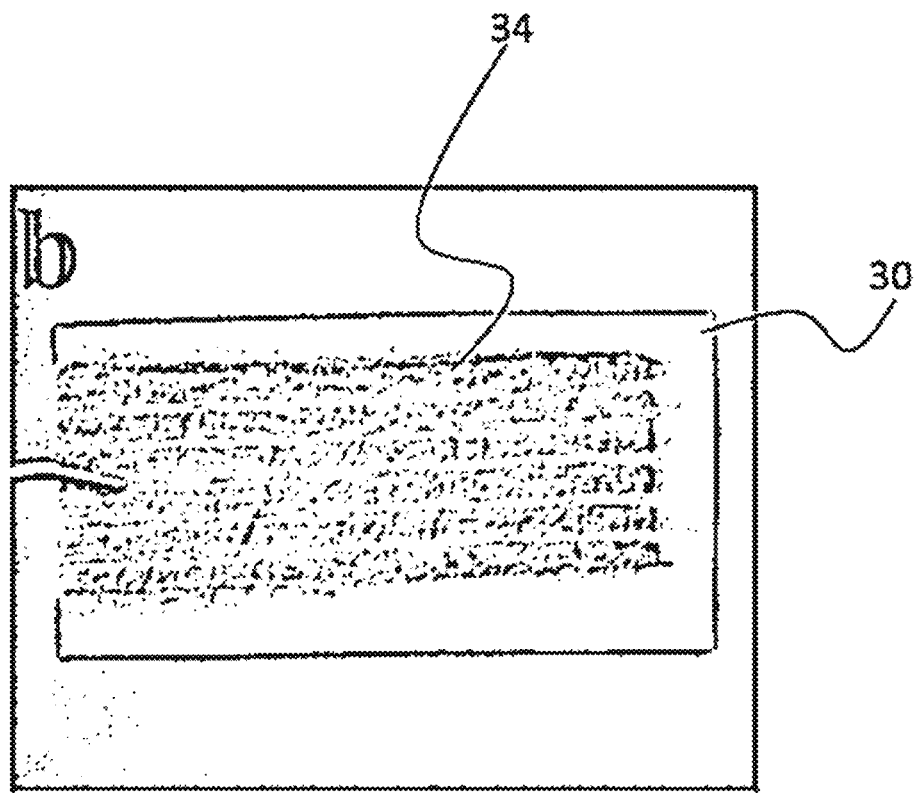
FIG. 2B is an optical image uncoated cellulose paper ofter 3 hours of electroless copper deposition.
Figure 2C:
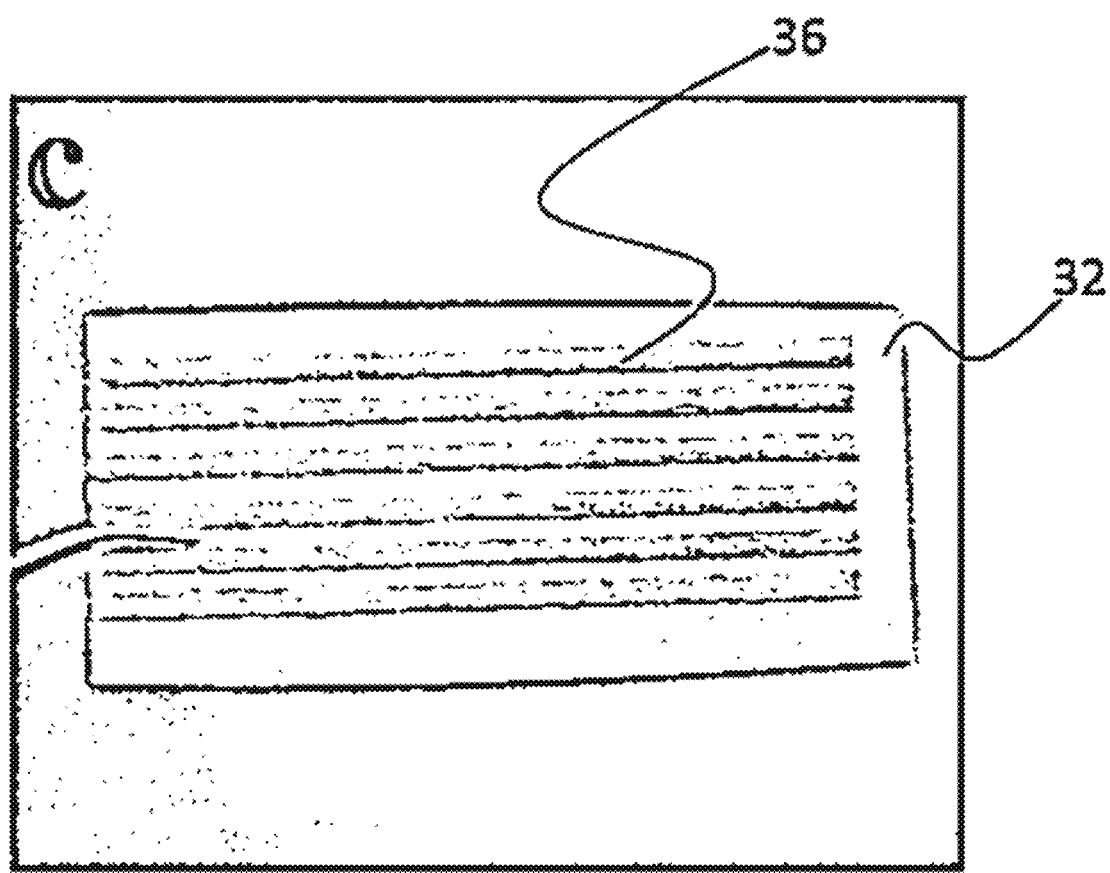
FIG. 2C is an optical image of coated and cross-linked cellulose paper after 3 hours of electroless copper deposition.

Referring to FIG. 2A to 2C, the benefits of applying the coating solution to the porous substrate are demonstrated through the measuring and identification of spectra associated with the presence of key functional groups for catalyst metal ion bonding. FIG. 2A compares FT-IR spectra of porous substrate samples after different treatments. Specifically, the different porous substrate samples are uncoated cellulose paper, coated cellulose paper before thermal treatment and coated cellulose paper after treatment. By comparing the spectra from the FT-IR results of the uncoated cellulose paper and the coated cellulose paper with the standard infrared transmittance spectra the interactions between different functional groups on the cellulose paper and coating can be determined. In comparing the uncoated and coated cellulose papers prior to thermal treatment, bands at 821, 1415, 1553, 1600 $cm^{-1}$ corresponding to pyridine groups are present only on the spectra of coated cellulose papers. This suggests that the P4VP molecules have been successfully introduced and attached in the functional coating layer. The peaks at 915 and 1245 $cm^{-1}$ correspond to the stretching vibration bands of epoxide groups in SU-8, and the peaks at 1443 and 1292 $cm^{-1}$ match the stretching frequency of C—N—C and N—C, respectively, which belong to the pyrrolidone groups in PVP. The presence of these peaks proves that PVP and SU-8 are present on the coated cellulose paper, and that these compounds can then act to improve the deposition process.

After thermal treatment, the stretching vibration band of epoxide groups at 1245 and 915 $cm^{-1}$ are weakened greatly, which suggests the occurrence of the crosslinking reaction. Two peaks appear at 1640 and 1658 $cm^{-1}$, which are not present in either of the spectra of the non-heat treated samples and this can be ascribed to the newly-formed carbonyl groups of pyridone and the unconjugated carbon double bonds. Additionally, the peaks for pyridine groups at 1415 and 1600 $cm^{-1}$ show a slight decrease in transmittance while the other two pyridine peaks at 821 and 1553 $cm^{-1}$ have the same transmittance. This indicates that only a small amount of pyridine ligands reacts with epoxide groups during the thermal treatment process, resulting in many available pyridine groups remaining along the cellulose fibers to uptake silver ions in the following step. FIG. 2B shows an uncoated cellulose paper 30 after 3 hours of ELCD and FIG. 2C shows a coated cellulose paper 32 after 3 hours of ELCD. Both cellulose paper samples were prepared using the same method except for the coating step which the cellulose paper sample 30 of FIG. 2B did not have.

Referring to FIG. 2B, the uncoated cellulose paper 30 shows a loss of resolution after the ELCD step due to a lack of strong bonding between silver ions and nanoparticles and the cellulose paper 30. Highly water-soluble silver nitrate compound will migrate around when submerging the sample in the ELCD bath. Although silver nanoparticles will form at the very early stage of ELCD and the unique porous structure of cellulose paper will help trap silver ions to some extent, physical absorption may not be sufficient to fully prevent diffusion. In cases where extended ELCD is required to lower resistances, the severely diffused copper 34 will cover the whole area of the cellulose paper 30, leaving no printed feature on it.

FIG. 2C shows that the functional coating layer of the cellulose paper 32 results in improved diffusion prevention, more complete formation of printed features and less migration of the silver nitrate solution such that the method prints circuits having much higher resolution than the circuit of FIG. 2B. Upon subjecting the coated cellulose paper 32 to an ELCD for 3 hours, there is a limited amount of catalyst diffusion and discrete conductive copper traces 36 with sharp edges. The hydrophobic properties of SU-8 also function to greatly reduce printing ink bleeding on the coated cellulose paper 32, have a performance more similar to photopaper. The width of the copper trace 36 will increase by approximately 5%-8% in the first hour of ELCD and remain almost unchanged in the following hours. A resolution of approximately 90 μm can be achieved for 5 hours ELCD using the proposed method. Generally the longer the duration of the ELCD process the better the conductivity is, but the resolution of the printed circuits will decrease.

Surface Morphology Studies

The printed electronics on the porous substrate resulting from the proposed method for depositing metallic ions onto a porous substrate demonstrates altered surface morphology during and upon completion of the ELCD process. Field emission scanning electron microscopy (FE-SEM) images of cellulose paper samples with ELCD process duration ranging from 0 to 5 hours are shown generally in FIG. 3A to FIG. 3I, demonstrating the formation of the copper-fiber structure within the cellulose paper. Each cellulose paper sample initially comprises cellulose fibers 40.

Figure 3A:
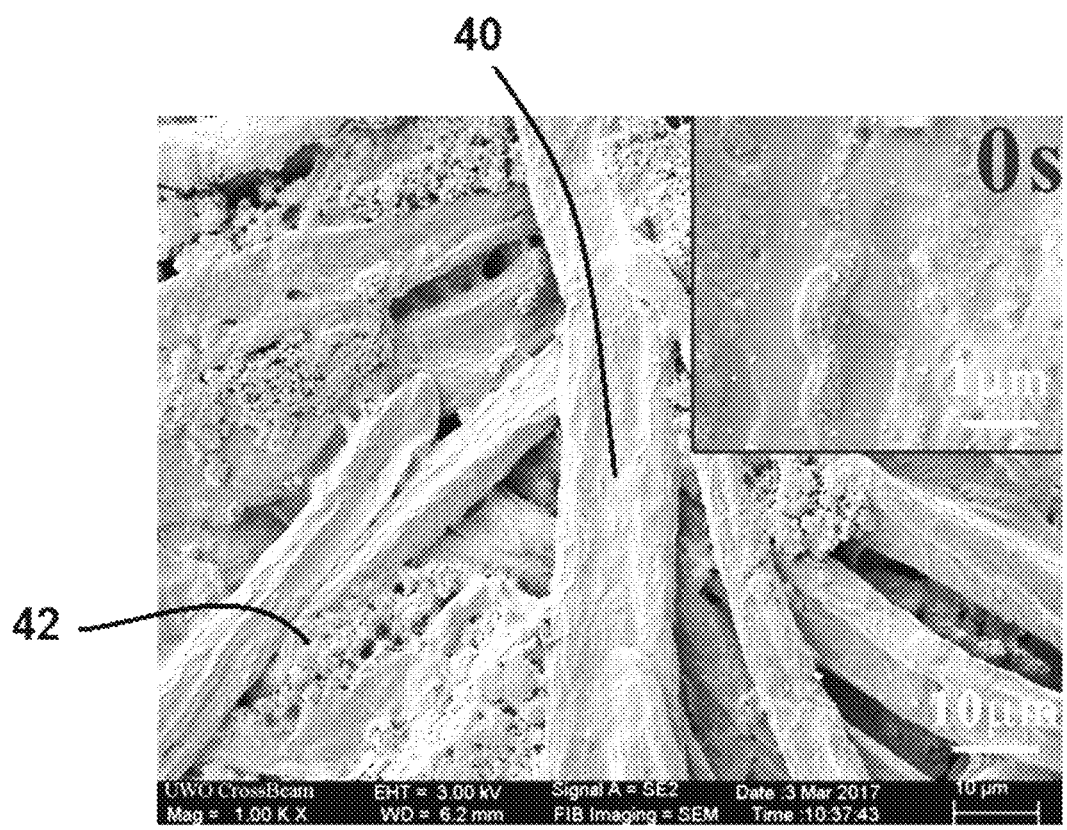
FIG. 3A to 3I is a series scanning electron microscope (SEM) image of the surface morphology of porous substrates after different durations of electroless copper deposition (ELCD). At the top right corner of each Figure is an enlarged view of the sample.
Figure 3B:
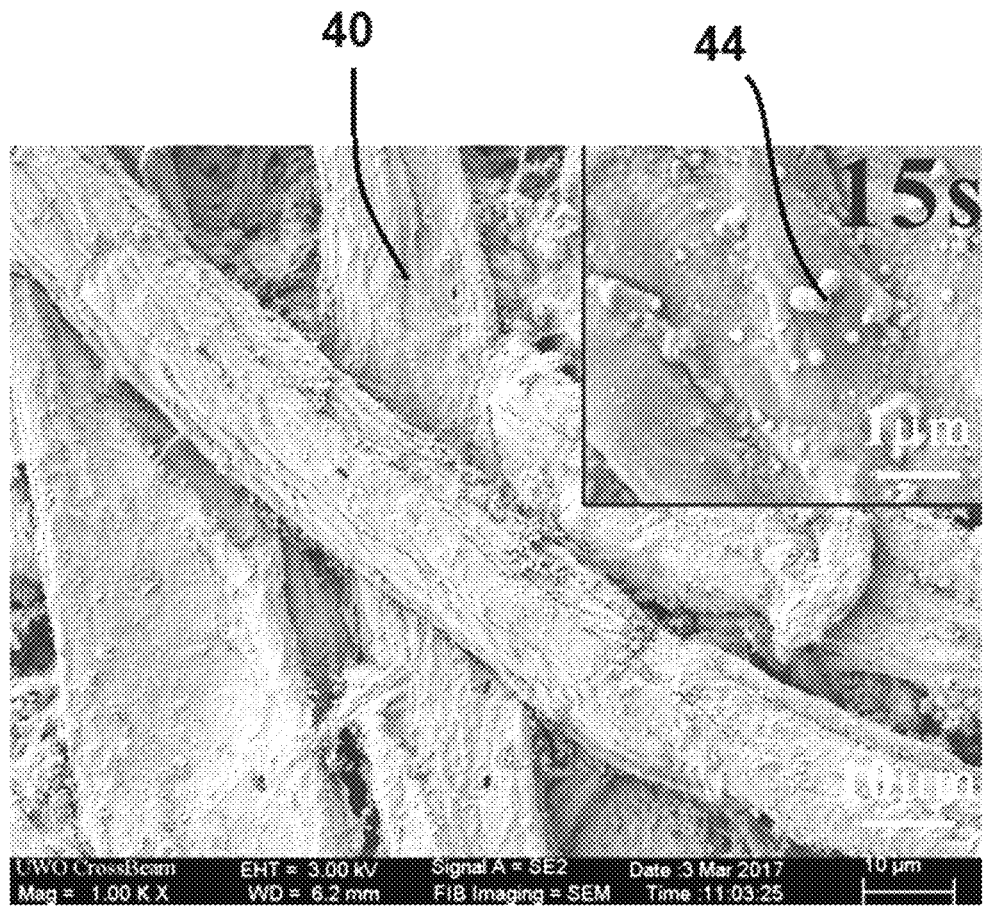
Figure 3C:
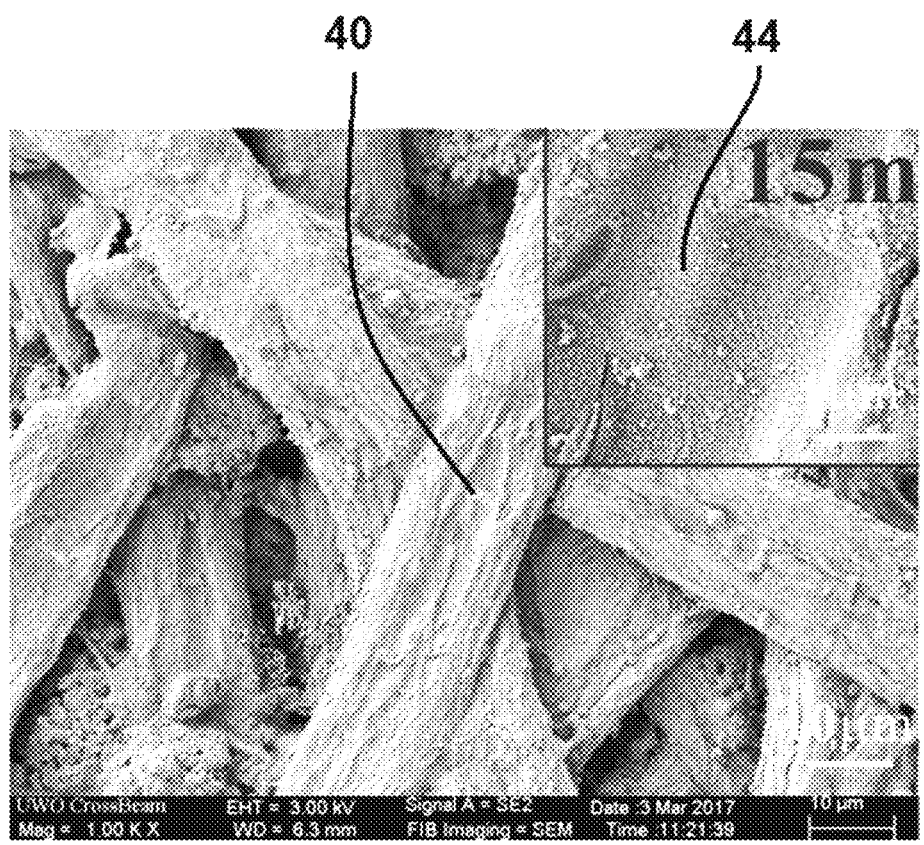

FIG. 3A shows the surface of the coated cellulose paper using the method shown in FIG. 1 after loading of silver ions via inkjet printing, showing a porous structure formed by irregularly arranged cellulose fibers 40. Silver nanoparticles 42 several nanometers in diameter can be observed along each fiber 40; these silver nanoparticles 42 are generated from a small fraction of the printed silver nitrate compound undergoing to self-decomposition in ambient condition. Referring to FIG. 3B, upon 15 seconds of time elapsed since the beginning of the ELCD process; copper nanoparticles 44 with diameters ranging from several nanometers to several hundreds of nanometers have formed on the surface of each cellulose fiber 40. FIG. 3C shows the surface of a cellulose paper sample after 15 minutes ELCD; most parts of the cellulose fibers 40 have been uniformly covered by copper nanoparticles 44 but the porosity of the cellulose paper sample remains mostly unchanged compared to the porosity of the cellulose paper sample shown in FIG. 3A.

Figure 3D:
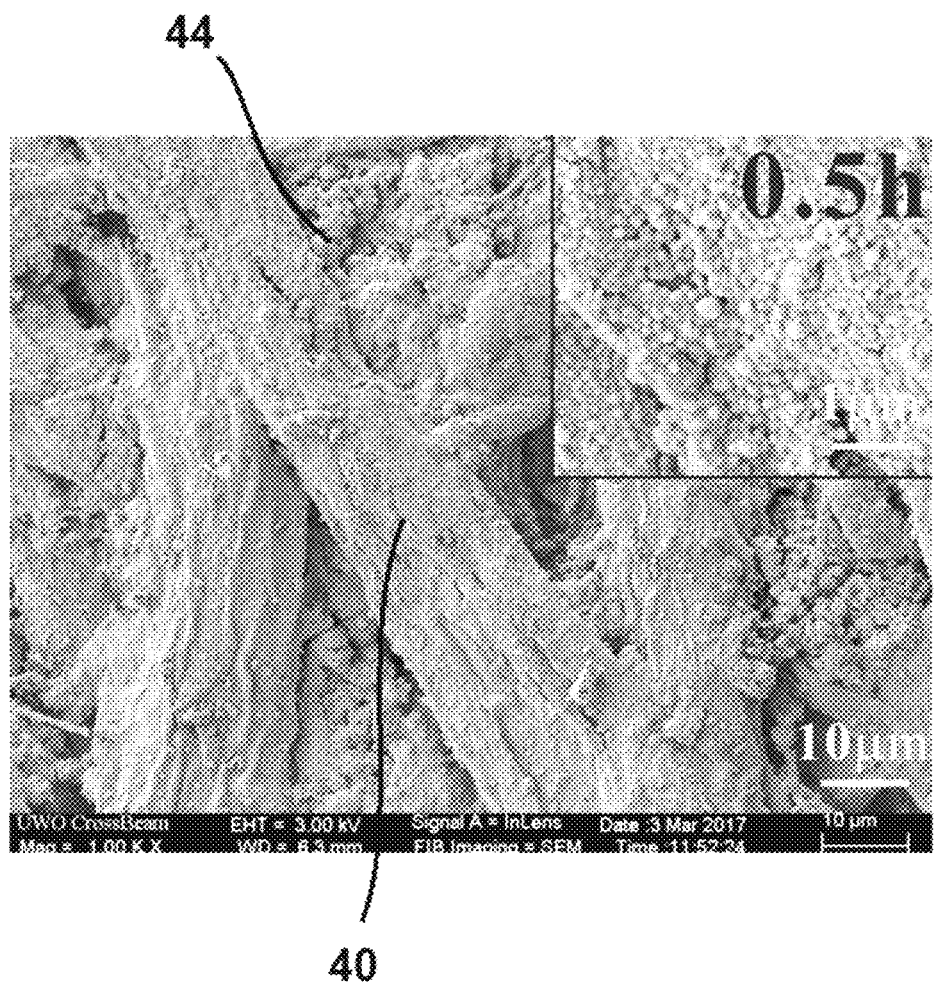
Figure 3E:
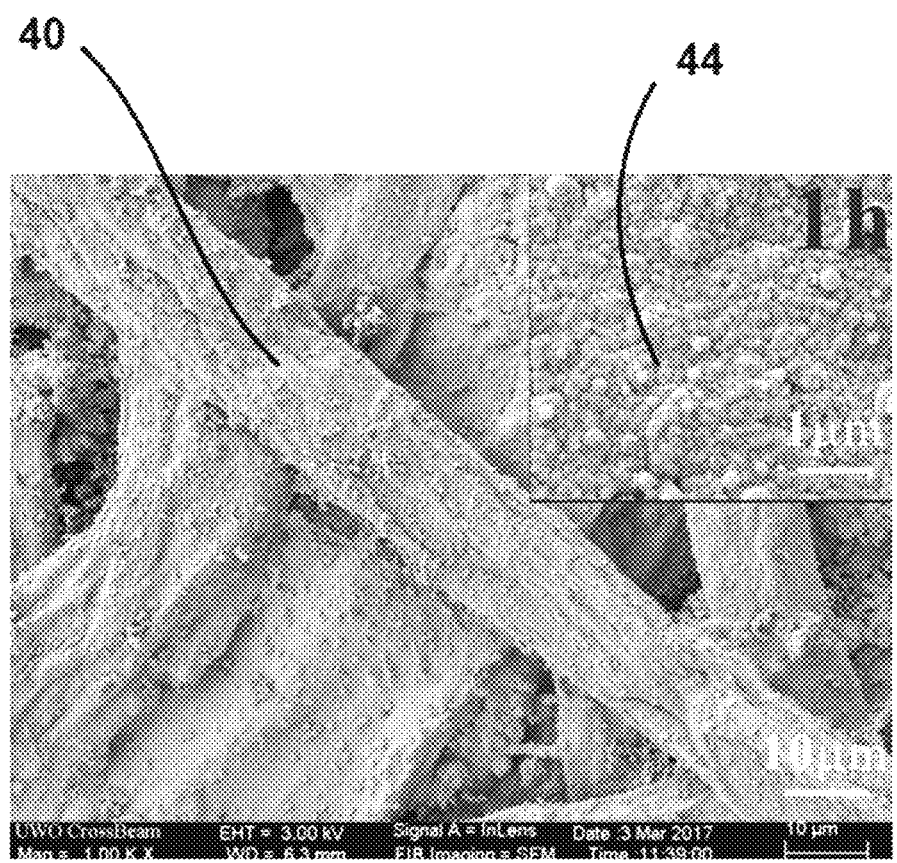
Figure 3F:
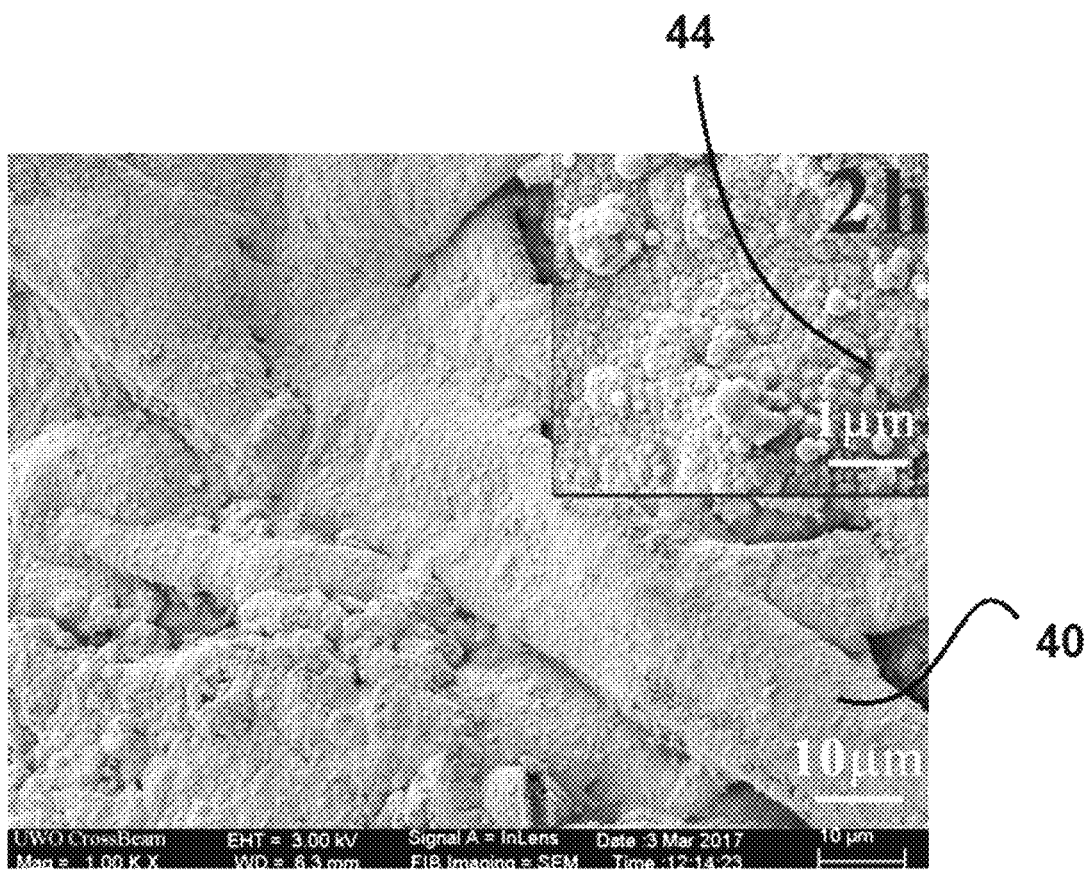
Figure 3G:
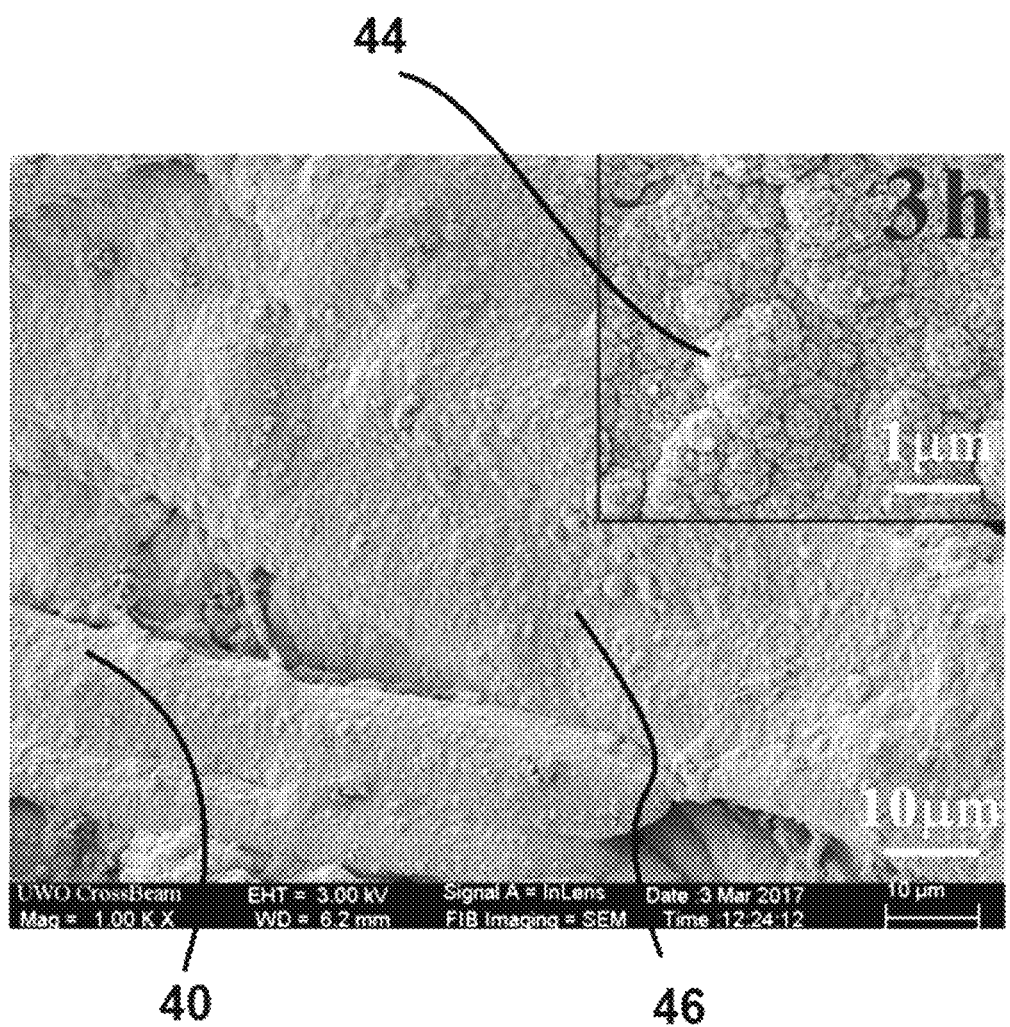

FIG. 3D to FIG. 3F are FE-SEM images of the cellulose paper samples after 0.5 hours, 1 hour and 2 hour ELCD, respectively. During this extended ELCD phase, copper nanoparticles 44 of larger sizes are generated at high densities on the cellulose fibers 40, while gaps between the cellulose fibers 40 are gradually filled in by the newly bonded copper. FIG. 2F shows a cellulose paper sample after 2 hours, the coated cellulose fibers 40 have been covered by more and more copper nanoparticles 44 and the porosity of the cellulose paper sample has greatly decreased relative to the porosity of the cellulose paper sample of FIG. 3A, but all cellulose fibers 40 remain distinct. FIG. 3G shows a cellulose paper sample after 3 hours, cellulose fibers 40 with distinct edges are barely seen, since most gaps have been filled in by deposited copper 44, indicating formation of the copper-fiber structure 46.

Figure 3H:
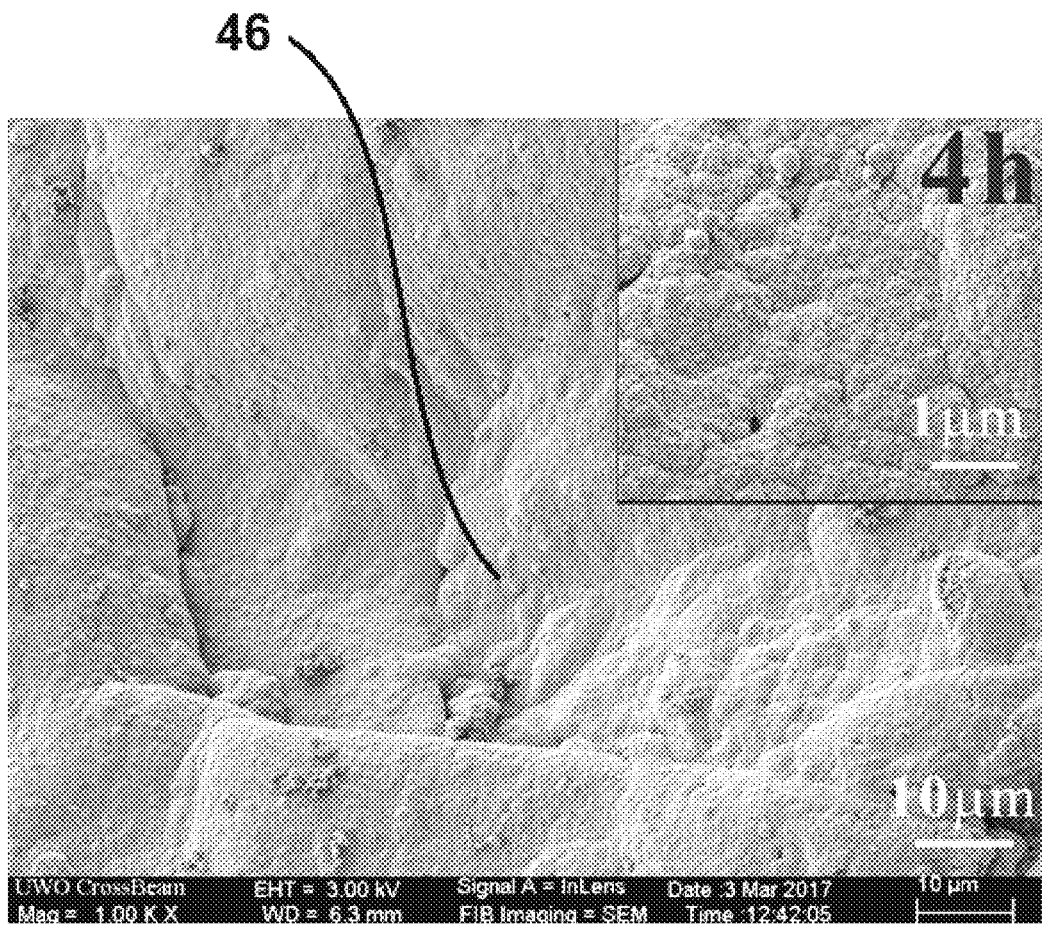
Figure 3I:
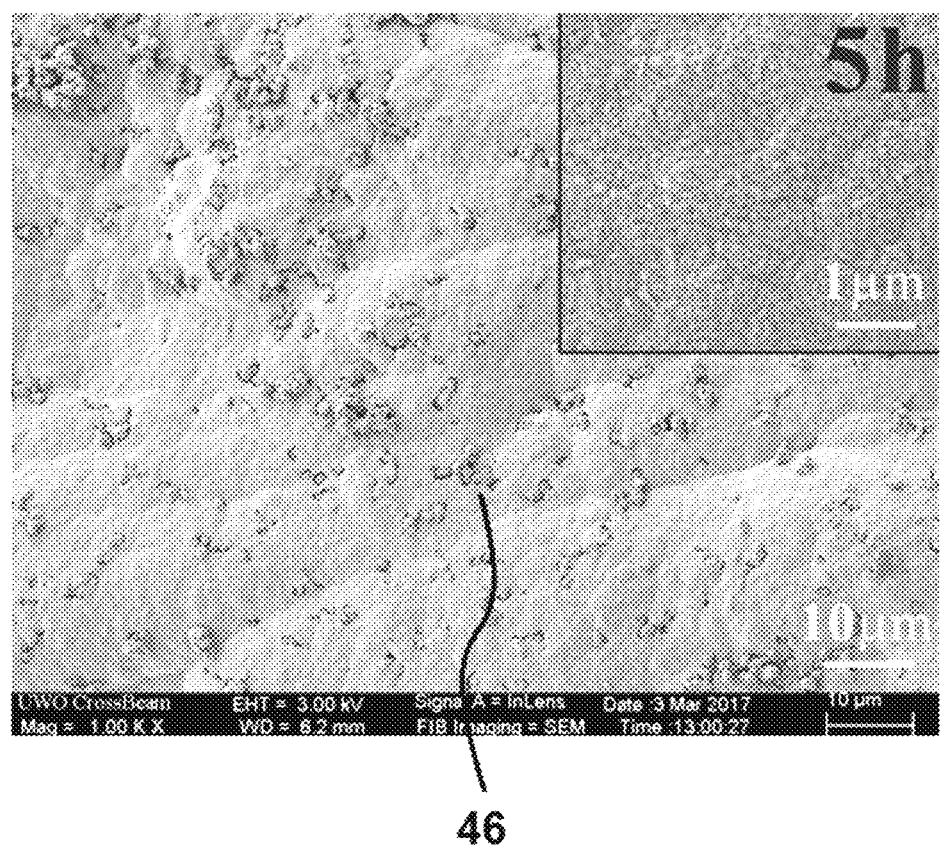

After formation of the copper-fiber structure 46 from the proposed method, the most significant copper growth will occur on the surface of the cellulose paper. Referring to FIG. 3G to FIG. 3I, corresponding to surface morphologies of 3 h, 4 h and 5 h ELCD cellulose paper samples respectively, it is apparent that the ELCD process as proposed results in a gradual smoothing of the surface as more copper is deposited. Referring specifically to FIG. 3I, when 5 hours have elapsed since the beginning of the ELCD process, no cellulose fibers are distinguishable on the surface and a majority of the pores in the cellulose paper have been filled in by deposited copper. The surface exhibits a slightly rippled morphology due to the underlying fiber structure.

More Studies of Surface Morphology

Figure 4A:
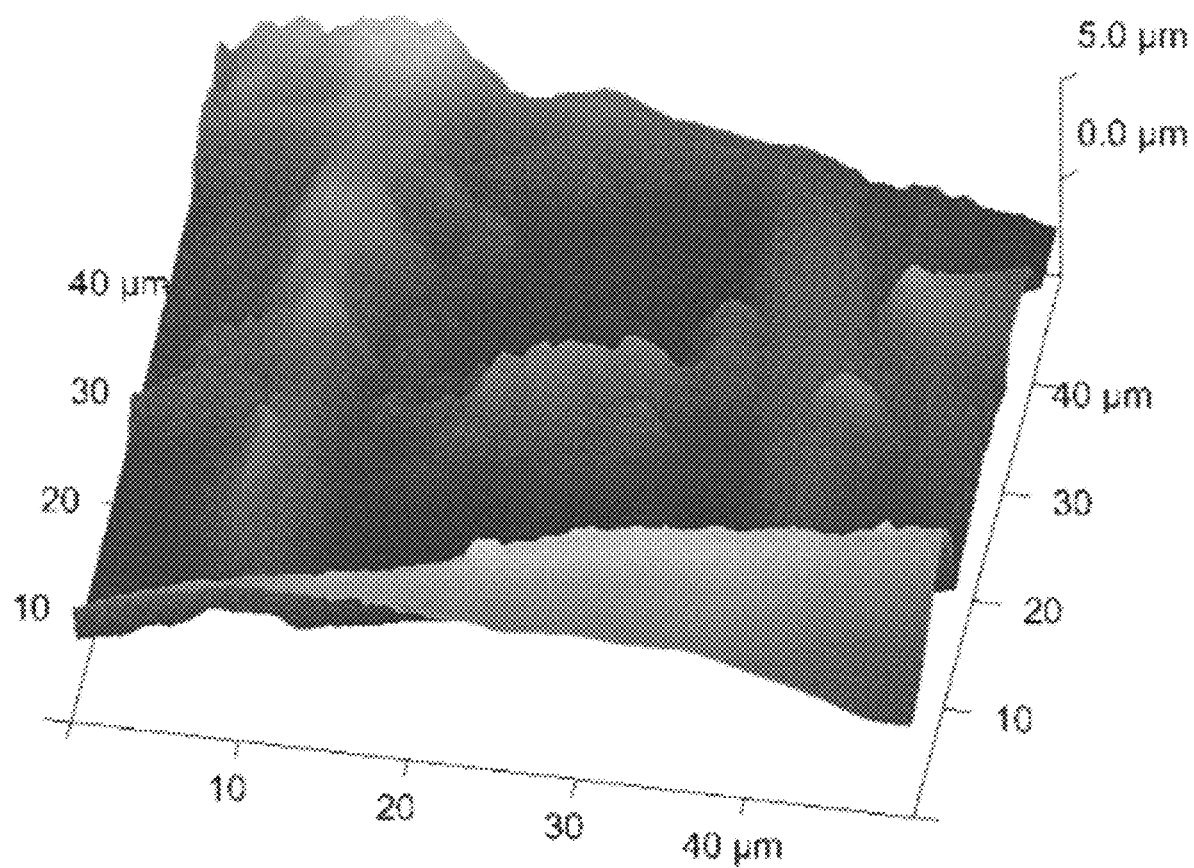
FIG. 4A is a three-dimensional AFM image of the surface morphology of a porous substrate before electroless copper deposition.
Figure 4B:
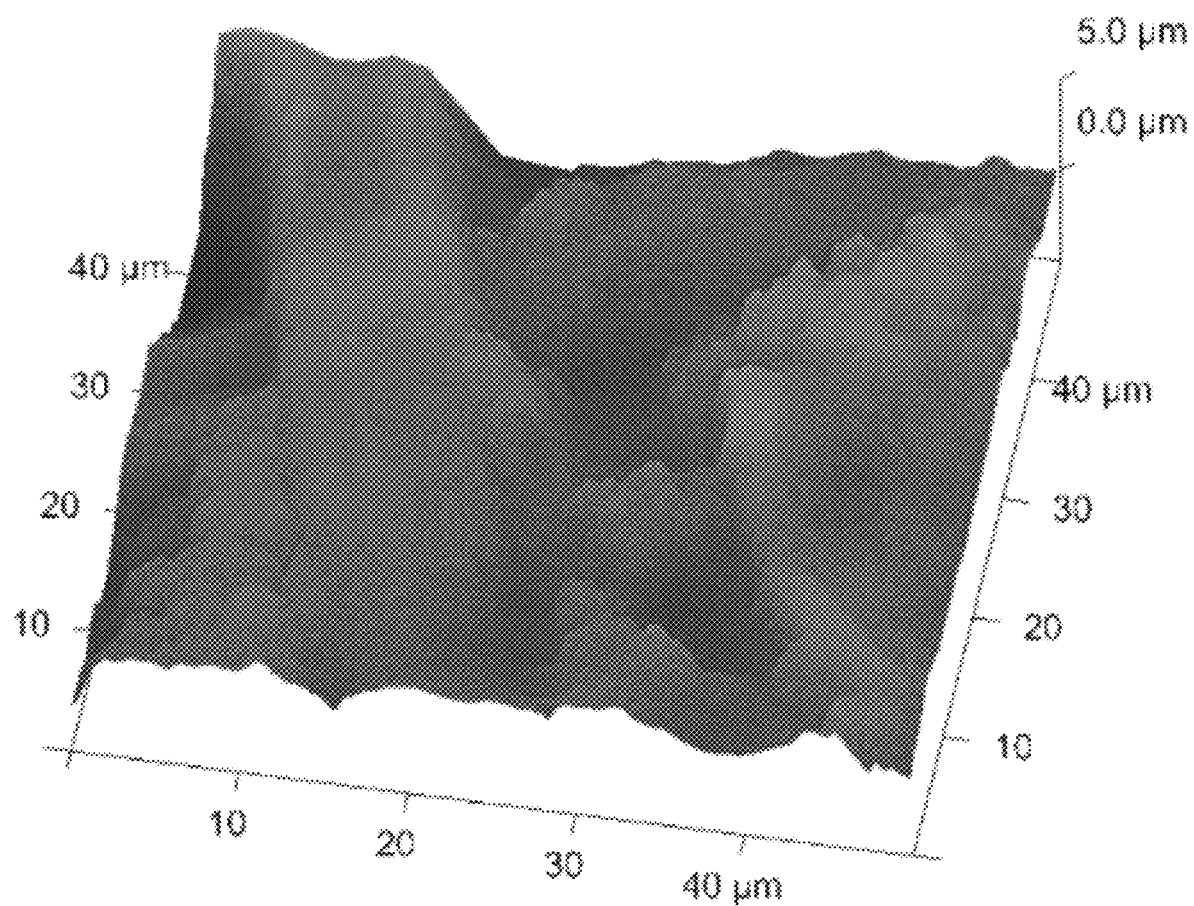
FIG. 4B is a three-dimensional AFM image of the surface morphology of the porous substrate of FIG. 4A after 2 hours of electroless copper deposition.
Figure 4C:
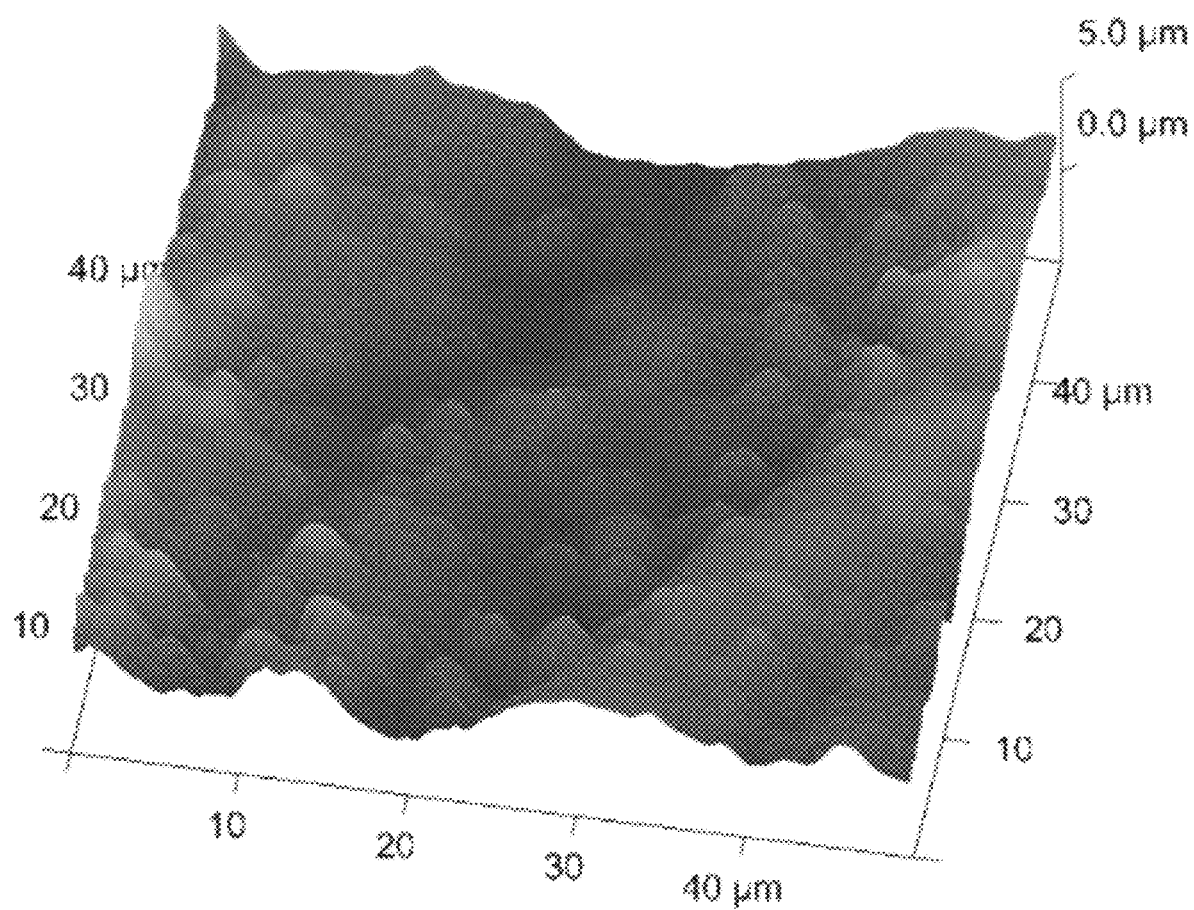
FIG. 4C is a three-dimensional AFM image of the surface morphology of the porous substrate of FIG. 4A after 5 hours of electroless copper deposition.

To achieve a better visualization of the surface morphology, an atomic force microscope (AFM) was used to characterize the aforementioned cellulose paper samples. FIG. 4A to FIG. 4C shows 3D images generated based on height information acquired from the AFM in tapping mode. FIG. 4A shows the 3D surface of a cellulose paper sample prior to ELCD, in a 50 µm×50 µm window. Cellulose fibers can be clearly identified in the image with many gaps in between. FIG. 4B and FIG. 4C show cellulose paper samples after 2 h and 5 h of ELCD respectively. Significant improvement of the deposited cellulose paper sample, surface morphology in comparison to pre-ELCD cellulose paper sample is demonstrated by a reduction in the average surface roughness of the substrate from a depth of 14.5 µm Ra with the 2 hours ELCD cellulose paper sample to a depth of 3.3 µm Ra for the 5 h ELCD cellulose paper sample. The reduction in the surface roughness can be explained by a gradual filling in of gaps between cellulose fibers in the cellulose paper with copper, as deposition progresses.

Figure 5A:
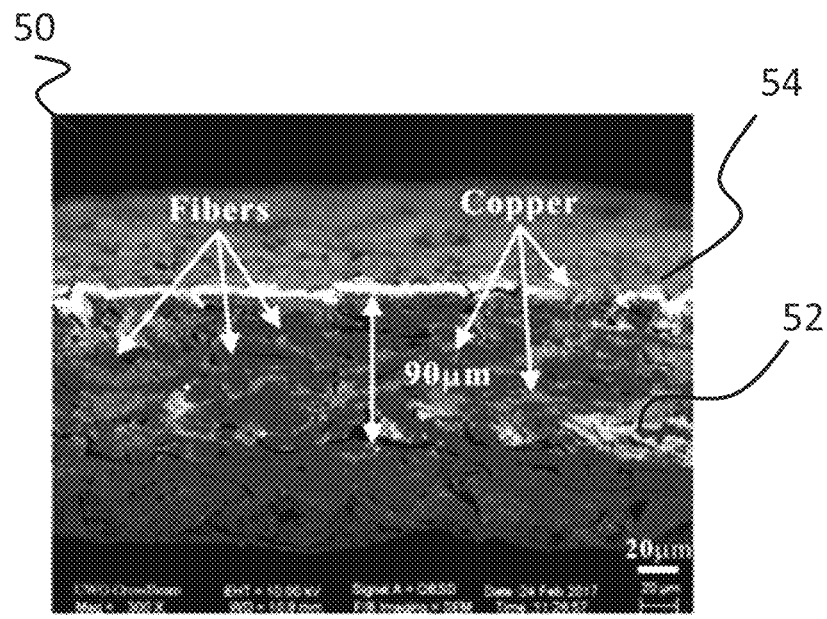
FIG. 5A is a FE-SEM cross-sectional image of a sample after 5 hours of electroless copper deposition, showing a copper-fiber conductive structure with thickness of around 90 μm.

FIG. 5A shows a cross-sectional image of the cellulose paper sample 50 after 5 h of ELCD process, showing presence of copper growth 52 underneath the surface, to a depth of around 90 µm. This indicates that with the proposed method printing ink droplets can penetrate a porous substrate of cellulose 50 paper to about 90 µm below the surface and activate a three-dimensional catalyst-loaded volume for ELCD.

Controlling Ink Penetration Depth

In theory, the penetration depth can also be fine-tuned by adjusting the printing parameters. For example, a jetting waveform can be used to control the volume and velocity of a single droplet, and droplet spacing can be used to adjust the printing ink volume per unit area, factors which have a dramatic influence on the depth of printing ink penetration. In FIG. 5A, we can also see that most of the gaps have been filled in with copper 52 at the catalyst-loaded area. On top of the surface of the cellulose paper sample, a thin layer of copper 54 with a thickness of around 2 µm can be observed, covering all of the deposited area. FIG. 5A further confirms the formation of a copper-fiber structure.

By controlling the printing ink penetration depth, the metal deposition depth of the coated porous substrate can be well controlled. For the same porous substrate and regular ambient environment, the penetration depth is dominated by the printing ink properties (surface tension, viscosity, boiling point) and printing ink volume per unit area. There are typically two methods to control the printing ink volume per unit area for a piezo inkjet printer. The first is to control the jetting waveform, where a higher peak jetting voltage will create a larger droplet. The second way is to control the droplet spacing where the closer the spacing of droplets deposited on the print surface, the higher printing ink volume per unit area. Utilizing the structure of the porous substrate, a sufficiently conductive interconnection between layers can be achieved such that the circuit performs well without physically drilling holes.

In an additional non-limiting example, the proposed method is utilized to form double sided circuits. In this example, the printing ink is a transition metal salt catalyst solution and is printed on both side of the coated porous substrate. An interconnection part between the layers of the porous substrate is printed using a smaller droplet spacing setting and higher jetting voltage for the inkjet printer settings, which results in a deeper penetration to a depth of more than 50% of the thickness of the porous substrate. As both sides are printed at the interconnection part, the transition metal salt catalyst solution will wet through the substrate, forming a highly conductive interconnection after completion of the electroless copper deposition process.

Figure 5B:
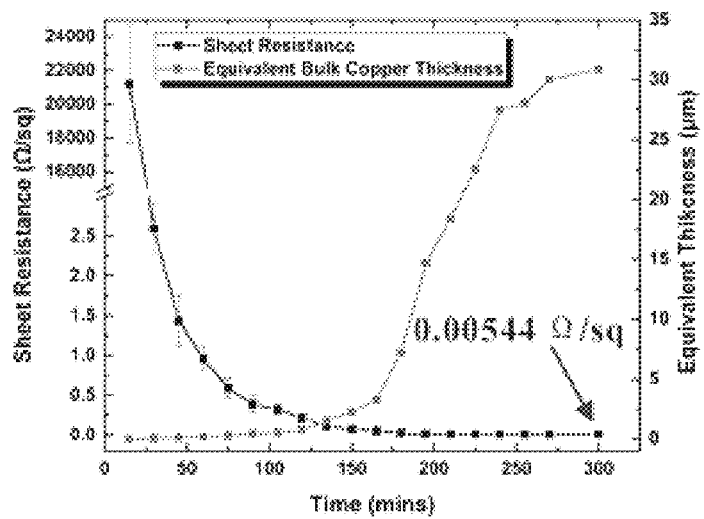
FIG. 5B is a graphical representation of the change of sheet resistance and its equivalent thickness in samples with different electroless copper deposition times ranging from 0 to 300 minutes.

The change of sheet resistance with ELCD time was investigated using a four-probe method. The sheet resistance was measured every 15 minutes during a 5-hour electroless copper deposition experiment. In the present embodiment cellulose paper was used as the porous substrate. Due to the unique porous structure of the cellulose paper, the thickness of the deposited copper is impossible to measure directly, as all cellulose paper samples have the same printing ink penetration depth. Thus, in order to quantify the amount of copper per unit area, we related the measured sheet resistance with the equivalent amount of bulk copper of a specific thickness the results are shown in FIG. 5B.

After 15 minutes of ELCD, the cellulose paper sample becomes conductive with a very high sheet resistance of approximately $2.15 \times 10^4$ Ω/sq, corresponding to the thin and loose copper layer shown in FIG. 3C. The sheet resistance quickly decreases during the first hour of ELCD, which is attributed to the growth and connection of copper grains. As the copper grains grows larger during the first hour, they progressively form more contacts with other grains and increase sheet conductivity, until finally, a dense and uniform copper layer is formed along each fiber shown in FIG. 3E. The cellulose paper sample exhibits the fastest growing rate in equivalent thickness from 2.5 hours to 3.5 hours, which may be attributed to the rapid formation of copper-fiber conductive structure and the three-dimensional copper deposition mechanism shown in FIG. 3A to FIG. 3H In the following 1.5 hours, the equivalent thickness growth rate decreases as most gaps have been filled with copper and thus copper growth mainly occurs on the surface. After 5 hours of ELCD, cellulose paper samples have a fairly low sheet resistance of approximately 0.00544 Ω/sq, which is the same as bulk copper with a thickness of approximately 30 µm. This value is difficult to achieve with any other printing method, and fulfills most thickness requirements of the printed circuit board industry. Thanks to the novel three-dimensional catalyst-loaded structure, we can also achieve a much higher average copper deposition rate (~6 µm/h) than in our previous ELCD papers.

Traditionally, if a piece of electroless deposited copper is thicker than 10 µm, then the copper coating tends to delaminate or bubble up from the cellulose paper due to the lack of interlock between the top copper layer and the cellulose paper. In the disclosed method, the functional coating layer and the cellulose fiber itself act as chemical and physical anchors for the deposited copper to achieve strong adhesion, preventing any delamination or peeling of the deposited copper. An ASTM standard tape test was conducted to evaluate deposited copper adhesion in the freshly prepared samples. During the test, deposited copper conformally adhered to the surface during all iterations except the first, when an extremely small amount of surface copper particles was removed. The sheet resistance also remained unchanged throughout all iterations, demonstrating excellent adhesion according to the ASTM D3359 standard.

Figure 6A:
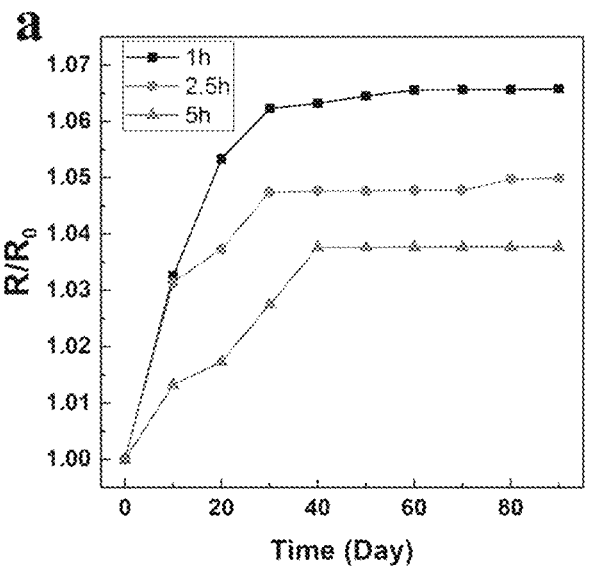
FIG. 6A is a graph of the resistance change of copper-fiber conductive traces with different electroless copper deposition times of 1 hour, 2.5 hours and 5 hours as a function of time.
Figure 6B:
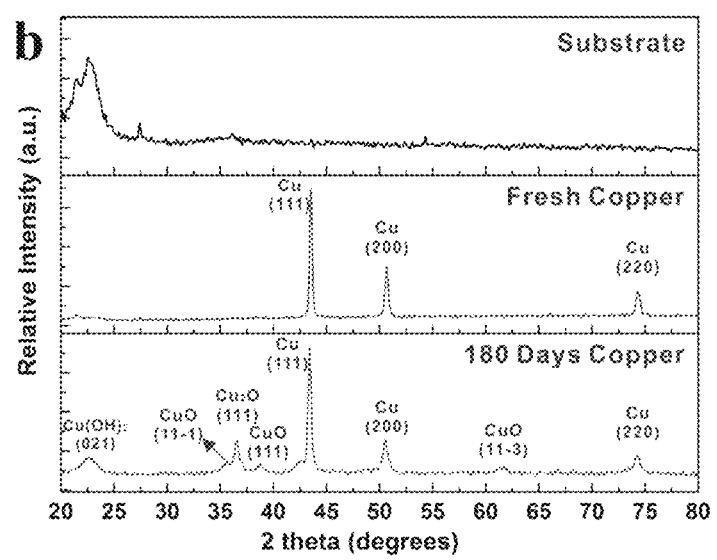
FIG. 6B is a graph of the X-ray diffraction spectra of a porous substrate before electroless copper deposition, freshly deposited copper traces and copper traces stored in air for 180 days, from top to bottom respectively.

The porous structure of cellulose paper greatly enhances its deposition rate, adhesion and flexibility; however, the drawback of such a porous structure is that it could be more easily oxidized in air. Hence, the relationship between resistance and storing time was investigated. FIG. 6A shows the resistance change of cellulose paper samples with 1 hour, 2.5 hours and 5 hours ELCD time over a period of 90 days. All cellulose paper samples were left out in open air in a room without any temperature or humidity control. The resistance of all cellulose paper samples increases at a nearly constant rate of about 0.15% per day for the first 30 days before plateauing afterwards. The sample with the longest ELCD time of 5 h exhibits the smallest increase in resistance after 90 days (3.5%), which may be attributed to its lower porosity and the generation of a thin copper top layer due to the longer duration ELCD. The other two cellulose paper samples show slightly higher increases, with the maximum resistance increase of approximately 6.5% seen in the 1 h ELCD sample. X-ray diffraction (XRD) was conducted to study the crystalline structure of the resultant copper layer, as well as the surface metal composition of fresh cellulose paper samples compared to samples stored for 90 days. FIG. 6B presents the XRD patterns of the coated cellulose paper sample, freshly made copper, and copper stored in air for 180 days. Both the cellulose paper sample with freshly made copper and the sample with copper stored for 180 days were prepared with a 2 hour ELCD process. Both freshly prepared cellulose paper samples showed peaks at 43.46°, 50.43° and 74.25° that could be assigned to Cu crystal plane (111), (200) and (220), respectively (JCPDS Data 04-836). For the cellulose paper sample stored in air for 180 days, several new weak peaks appeared in the spectrum. Peaks at 23.8° and 36.4° correspond to the (021) plane of $Cu(OH)_2$ crystal (JCPDS Data 80-0656) and (111) plane of $Cu_2O$ (JCPDS Data 05-0667) crystal, respectively. The other three very weak peaks at 35.5°, 38.70 and 61.5° can be assigned to the (11-1), (111) and (11-3) planes of CuO (JCPDS Data 48-1548), respectively, indicating a very small amount of CuO present on the surface. From the XRD results, we can conclude that oxidation from extended storage in open air generates mostly $Cu_2O$ and $Cu(OH)_2$. Furthermore, most oxidation takes place in the first 30 days and has limited influence on the resistance of the cellulose paper samples (<10%). It is also worth mentioning that the circuits could be easily protected from oxidization using either conformal coatings or electroless nickel deposition for longer shelf life.

EXAMPLES

The present invention can be further understood by one skilled in the art with reference to the following examples, which the inventors' technology is not limited to in scope. Various modifications of the present technology in addition to those described to herein will become apparent to those skilled in the art from this description and accompanying figures. To achieve more reliable and predictable results from printing electronics on porous substrates, several methods are disclosed herein to achieve surface modification of the porous substrate for bonding enhancement.

Example 1

Surface Modification of Porous Substrate

In one example of the coating, surface modification of the porous substrate method, cellulose paper is utilized as the porous substrate. The cellulose paper is directly immersed into a coating solution of P4VP and SU-8 for 5 seconds. The cellulose paper is then slowly drawn out of the coating solution and dried in air at room temperature for 5 minutes. Lastly, the coated cellulose paper was placed into an oven at 135° C. for 20 minutes for in-situ cross-linking of SU-8 and P4VP molecules. One of ordinary skill in the art will appreciate that the above recited process is non-limiting and that the duration of each step may vary as long as the porous substrate after coating is suitable for the application of the method of the disclosure.

Example 2

Fabrication of Highly Conductive Circuit

In one example, a highly conductive circuit is fabricated on a porous substrate. In this particular example, the conductive circuit is formed of a prepared, printing ink which is deposited via printing on the porous substrate surface. The printing ink is prepared by first mixing a glycerol-water solution of anhydrous glycerol and distilled water at a volume ratio of 3:2. Silver nitrate is then added, followed by mixing in a VWR mixer for 4 minutes to form a 60 mg/mL silver nitrate compound. The silver nitrate compound is degassed in a vacuum chamber to remove dissolved gases and bubbles. This particular example of the printing ink had a resulting viscosity and surface tension of 11.5 cp and 53.5 mN/m, respectively. However, one of ordinary skill in the art would appreciate that a variety of printing ink formulations could be used, so long as they contained a sufficient conductor particle concentration and so long as the resulting fluid properties allowed for sufficient control of droplet size and speed in the optimum operating range for the system's inkjet printer. In one non-limiting embodiment, a Dimatix DMP-2800 is used as the systems inkjet printer but one of ordinary skill in the art will appreciate that other inkjet printers can be used.

A 0.2 µm nylon syringe filter was used to remove undesired particles from the printing ink. The printing ink was filled into a cartridge mounted on a 10 µL piezo-electric drop-on-demand (DOD) inkjet printhead. The jet of droplets from the inkjet printer are produced using a droplet space setting in the range of 25 µm-50 µm. Additional printing parameters were set as following: meniscus vacuum, 3.5 inch of $H_2O$; print head temperature, 25° C.; print head angle: 4.2°; jetting voltage 25.1 V. Printing was conducted at room temperature. An electroless copper deposition (ELCD) bath consisting of CuSO4.5H2O (14 g/L), NaOH (12 g/L), potassium sodium tartrate (16 g/L), EDTA-2Na (20 g/L), HCHO (26 mL/L), 2,2'-dipyridyl (20 mg/L), and potassium ferrocyanide (10 mg/L) was prepared according to literature. Cellulose papers with a functional coating layer and with printed silver nitrate compound patterns were immersed into the bath for different periods of time.

Example 3

Fabrication of Multilayer Circuits without Drilling

In an additional, non-limiting example, the proposed printing method is applied to the fabrication of multilayer circuits on multilayer substrates such that it is unnecessary to physically drill via holes in the multilayer substrate housing the PCB. In this particular embodiment, an printing ink filled cartridge is mounted on a 10 pL piezo-electric drop-on-demand (DOD) inkjet printhead. To achieve suitable printing results, various printing parameters including droplet spacing, meniscus vacuum, printhead temperature, printhead angle and jetting voltage were all fine-tuned to suitable parameters. In one non-limiting procedure, the following parameters were utilized: 30 µm droplet spacing for regular traces, from the inkjet printer has a droplet space setting from 2 µm-25 µm droplet spacing for via holes; a meniscus vacuum of 3.5 inch of $H_2O$; print head temperature of 25° C.; print head angle of 4.2° and jetting voltage 25.1 V. Smaller droplet spacing can result in higher printing ink volume per unit area, so that the printing ink will penetrate more into the porous substrate instead of remaining on the surface. By controlling the printing ink volume per unit area, the penetration depth can be well tuned in treated porous substrate, such that the substrate can have metal deposited at a desired depth.

Figure 10:
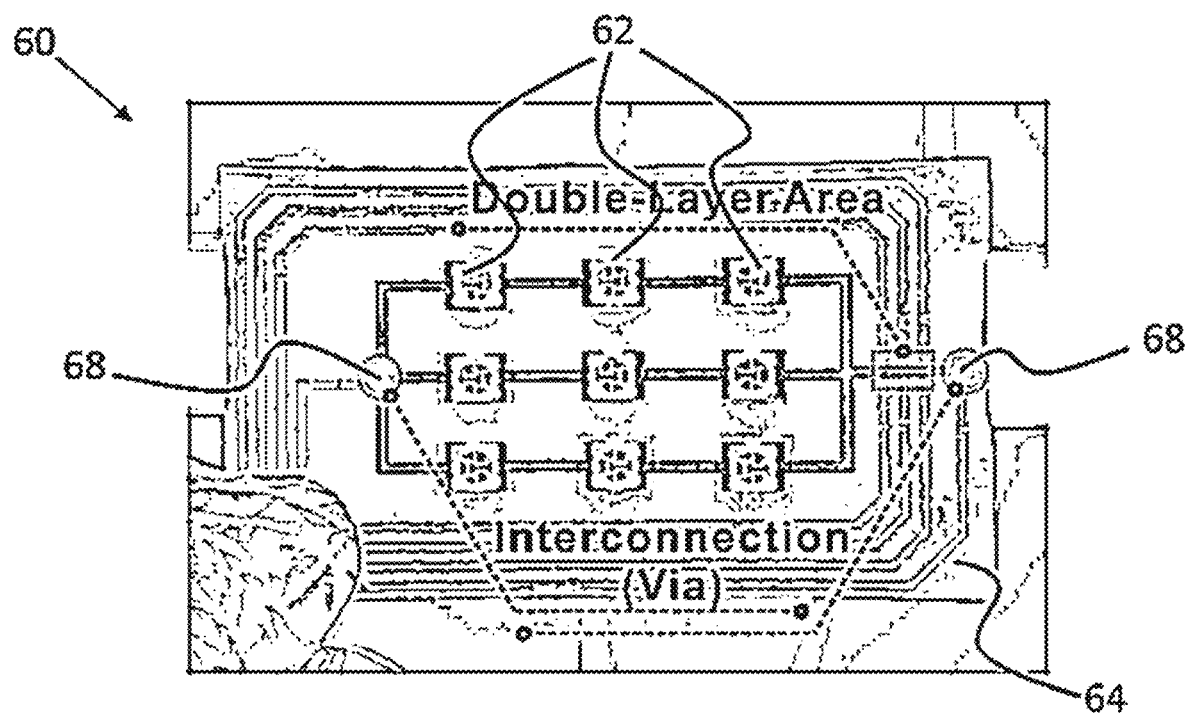
FIG. 10 is an optical image of a device which converts RF energy to electrical energy in a bent state to illuminate all LEDs.

After the printing ink is deposited on individual layers, inter-layer printing is to completed to ensure circuit conductivity across multiple-layers of the porous substrate. For the printing of this conductive material at the interconnection between layers of the multi-layer circuits, a smaller droplet spacing (<10 microns) is utilized such that the printing ink is able to penetrate all through the porous substrate, connecting the different, multilayers after electroless copper deposition. Circuits were printed on both side of the coated cellulose paper including regular traces and via holes. An ELCD bath consisting of $CuSO_4.5H_2O$ (14 g/L), NaOH (12 g/L), potassium sodium tartrate (16 g/L), $EDTA.2Na$ (20 g/L), HCHO (26 mL/L), 2,2'-dipyridyl (20 mg/L), and potassium ferrocyanide (10 mg/L). Coated cellulose papers with printed silver nitrate compound patterns were immersed into the ELCD bath for 3 hours. FIG. 10 shows a device 60 with double layer electrode with drill-free via hole working properly. On the front side, nine LEDs in an LED array 62 with different colors (yellow, orange and red) were mounted on to the device 60 using 3M conductive tape. On the reverse side, a receiving coil 64 operating at 150 kHz was fabricated, using the method proposed in this paper, to convert RF energy into electrical energy to power the LED array 62. The two terminals of the receiving coil 64 were then connected to the front side of the device 60 via two drill-less VIAs 66. The double-layered structure can be clearly seen in FIG. 10 when the device 60 is put under light. As a battery-free device, these LEDs will light up using only the energy harvested from the receiving coil 64. The fabricated device 60 is flexible, lightweight, and can be attached to many surfaces.

Example 4

Fabrication of RFID Antennae Using Cellulose Paper

Figure 11:
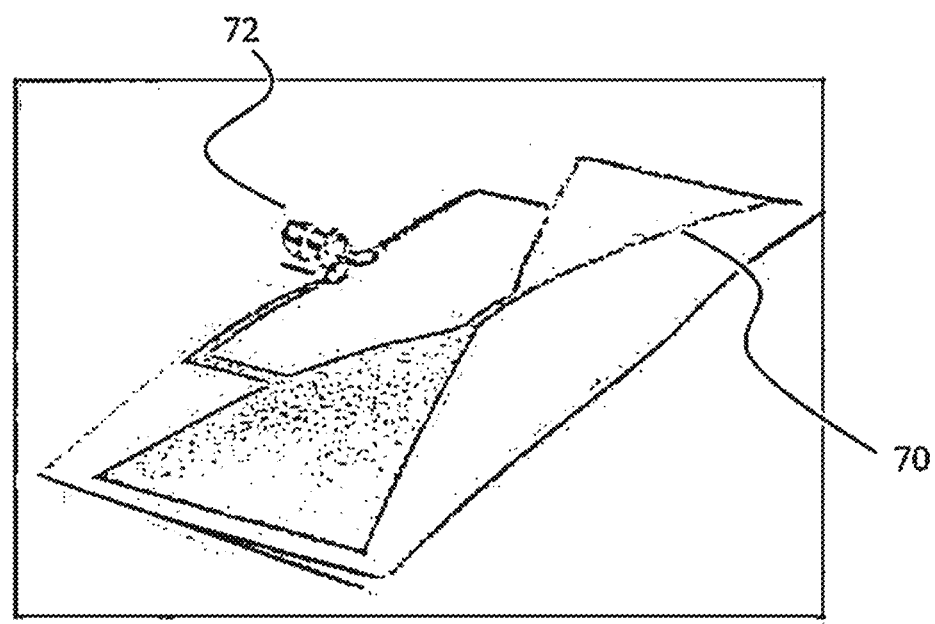
FIG. 11 is an optical image of a bow-tie type RFID antenna with an SMA adaptor attached to its terminal for testing.
Figure 12:
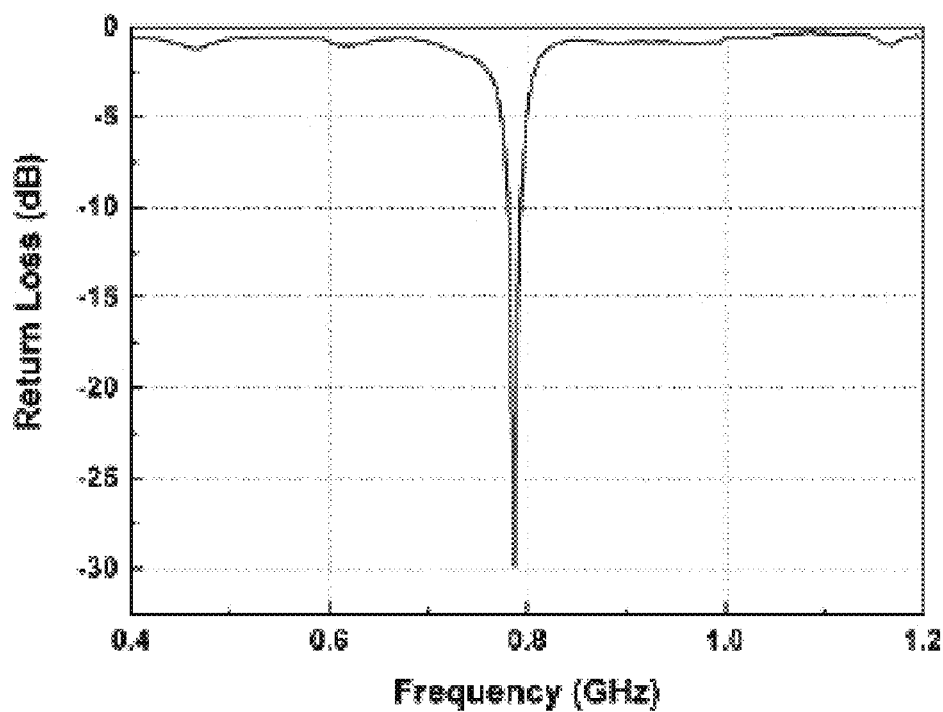
FIG. 12 is an graphical representation of the return loss of the RFID antenna with respect to RF frequency.
Figure 13:
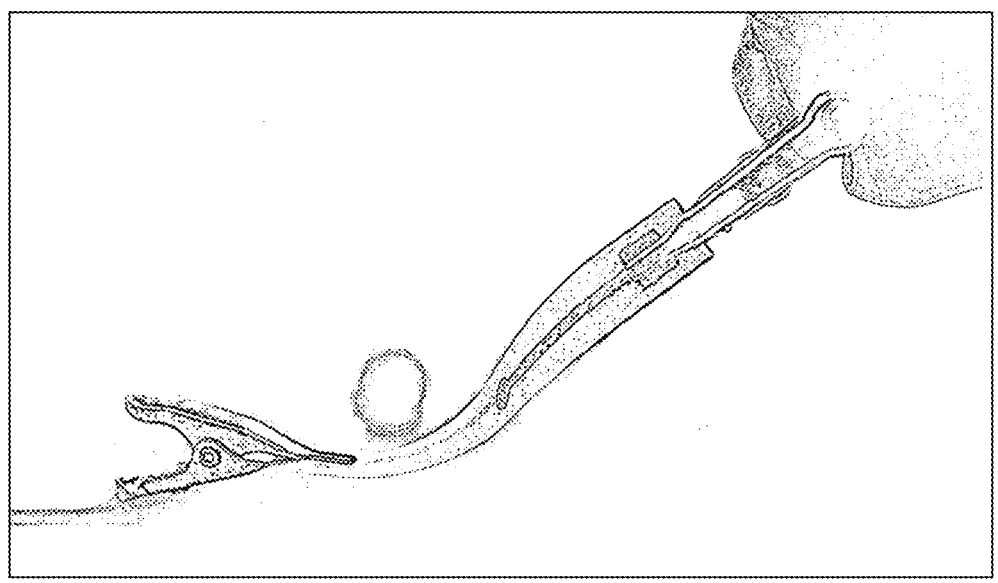
FIG. 13 is an optical image of a double layer electrode with drill-free via holes fabricated using the proposed invention.

In an additional example a paper-based RFID antenna 70 based on the popular bow-tie design may be fabricated using the method for fabricating metal-fiber conductive structures disclosed herein. This RFID antenna 70 demonstrates several of the advantages of using the proposed fabrication method. FIG. 11 shows an image of the antenna 70 with an SMA adaptor 72. The reflection coefficient of this antenna 70 was measured using an Agilent Network Analyzer and the result is presented in FIG. 12. Return loss quantifies how well energy of a selected frequency can be coupled from the transceiver to the antenna 70; the lower the value, the better the antenna 70. The measured center frequency is 780 MHz with a return loss of approximately −30 db, which is significantly lower than any result achieved by an additive printing process. The antenna 70 also exhibits an ultra-narrow working bandwidth of −15 MHz (775 MHz-790 MHz, <−15 db), making it very suitable for low-cost, energy-saving and interference-sensitive applications.

Example 5

Formation of Battery-Less Light Source

To investigate the mechanical flexibility of the fabricated features, a linear array 80 of five copper traces each 5 cm long and 2 mm wide spaced 1.5 mm apart was fabricated on cellulose paper using the proposed method. The linear array 80 was actuated between flat and bent states at a rate of 3 cm/s using a custom-made stretching stage 84 coupled to a computer-controlled step motor. A Kethley multimeter was connected to the two terminals 86 of the stretching stage 84 in a four-probe sensing mode to measure the resistance of the sample 80.

Figure 7A:
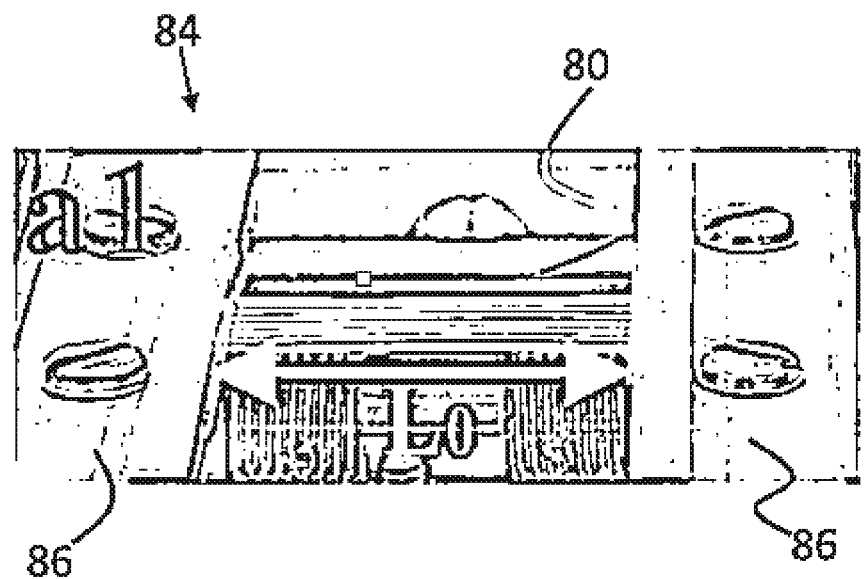
FIG. 7A is an optically acquired image of a copper electrode array in flat state with initial length of $L_0$.
Figure 7B:
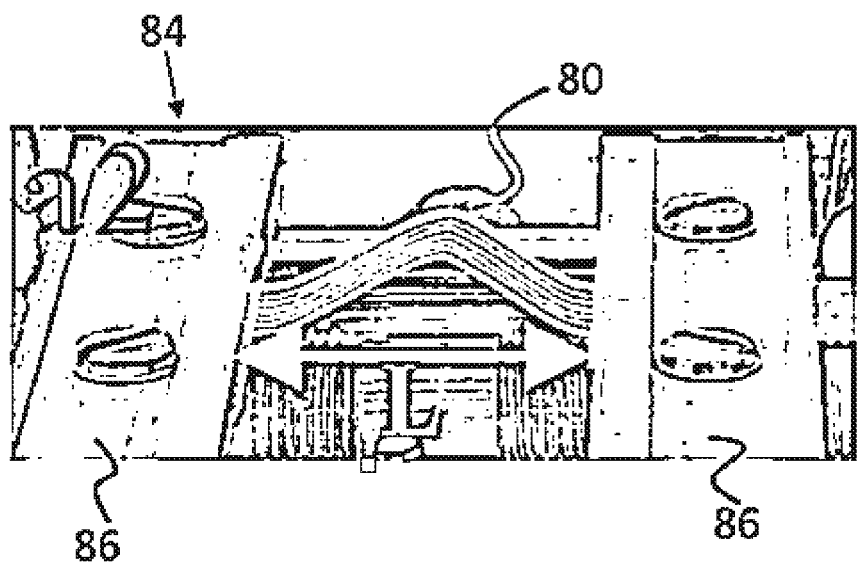
FIG. 7B is an optically acquired image of the copper electrode array of FIG. 7A in a bent state with length of L.
Figure 7C:
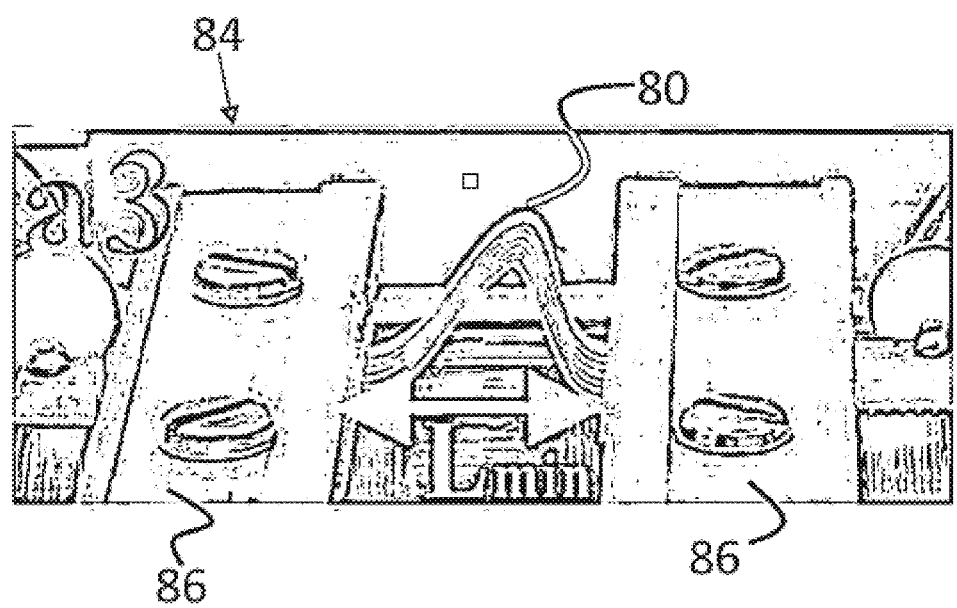
FIG. 7C is an optically acquired image of the copper electrode array of FIG. 7A in a bent state with maximum bend radii with $L_{min}$.
Figure 7D:
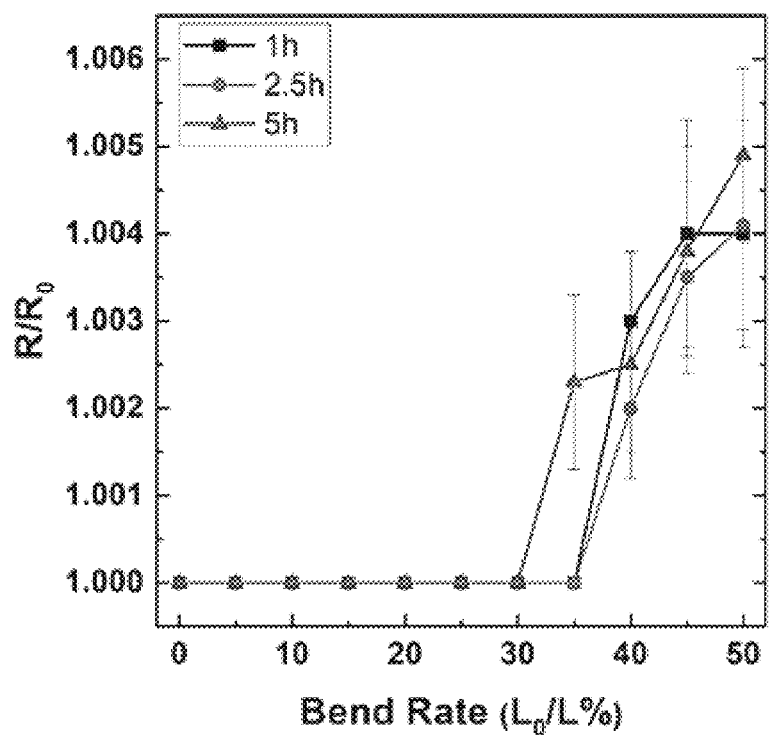
FIG. 7D is a graphical representation of resistance change in copper electrode arrays having varying electroless copper deposition times with respect to bend rate.

Referring to FIG. 7A, the linear array sample 80 fabricated with the proposed method using cellulose paper as the porous substrate is shown in a flat state. $L_0$ is the initial distance of the two terminals 86; this value is divided by the actual terminal distance L to calculate the "bend rate" of the sample 80, i.e. FIG. 7C shows a linear array sample 80 with a bend rate of 50% (Lmin=2.5 cm, L0=5 cm). FIG. 7D shows the average change in resistance under different bend rates, ranging from 0% to 50%. When the bend rate is less than 30%, the resistance is unaffected, and even when the bend rate exceeds 30%, there is just a slight increase in resistance (maximum increase of <0.5%). These results demonstrate the excellent flexibility of the linear array sample 80.

Figure 7E:
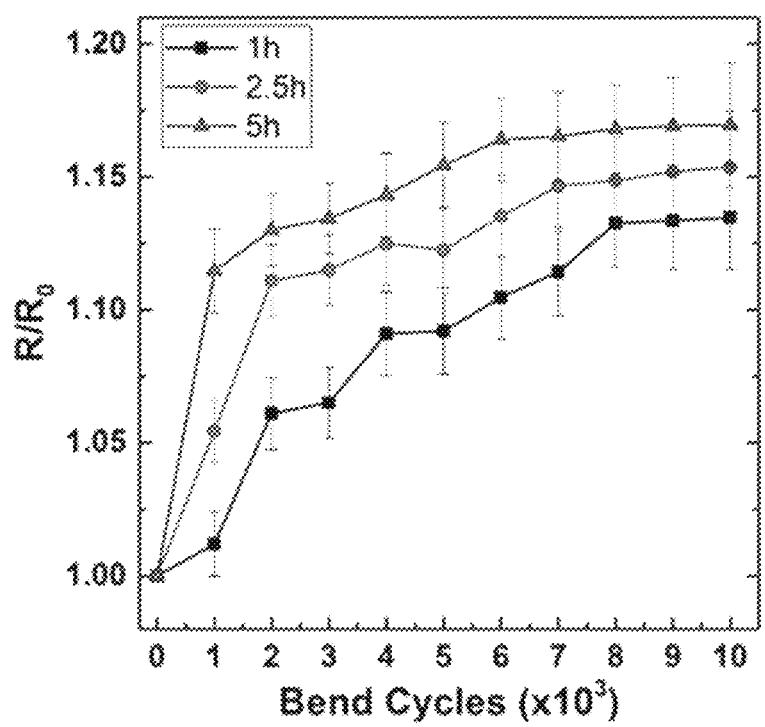
FIG. 7E is a graphical representation of resistance change in copper electrode arrays having varying electroless copper deposition times with respect to number of bend cycles.

FIG. 7E shows the measured resistance change of linear array samples with different ELCD times as a function of bend cycles, where for each cycle; the linear array sample was actuated from a bend rate of 0% to 50% at a speed of 3 cm/s. Linear array samples produced using the proposed method exhibit an increase in their electrical resistances during the first 2000 cycles, which thereafter continues to increase but at a slower rate. Linear array samples with a thinner copper top layer and shorter ELCD time will also exhibit a smaller increase in resistance. Overall, the flexible devices exhibit good bending durability after 10000 cycles, with a total resistance increase of 13%, 14% and 17% over original values for the 1 hour, 2.5 hours and 5 hours liner array samples, respectively.

Figure 8A:
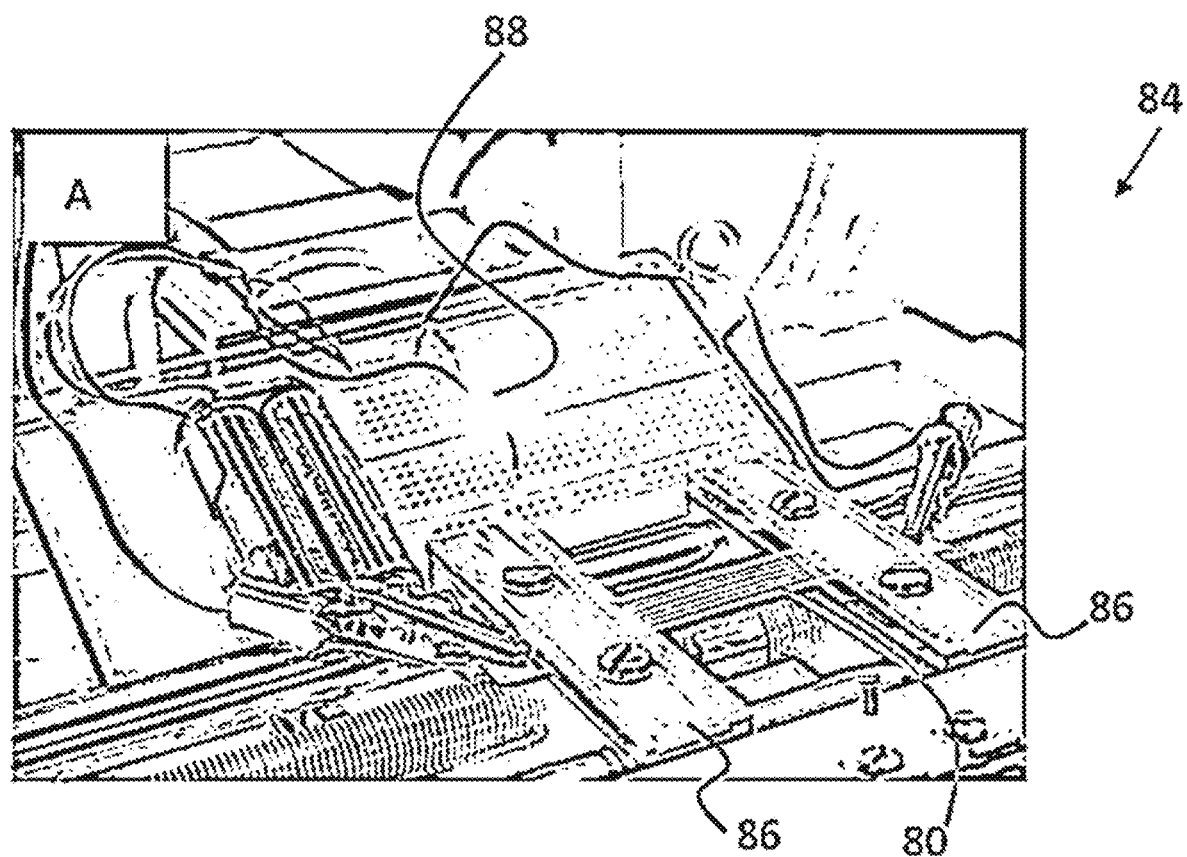
FIG. 8A is an optical image of an LED powered by the copper electrode array of FIG. 7A operating in a normal flat state.
Figure 8B:
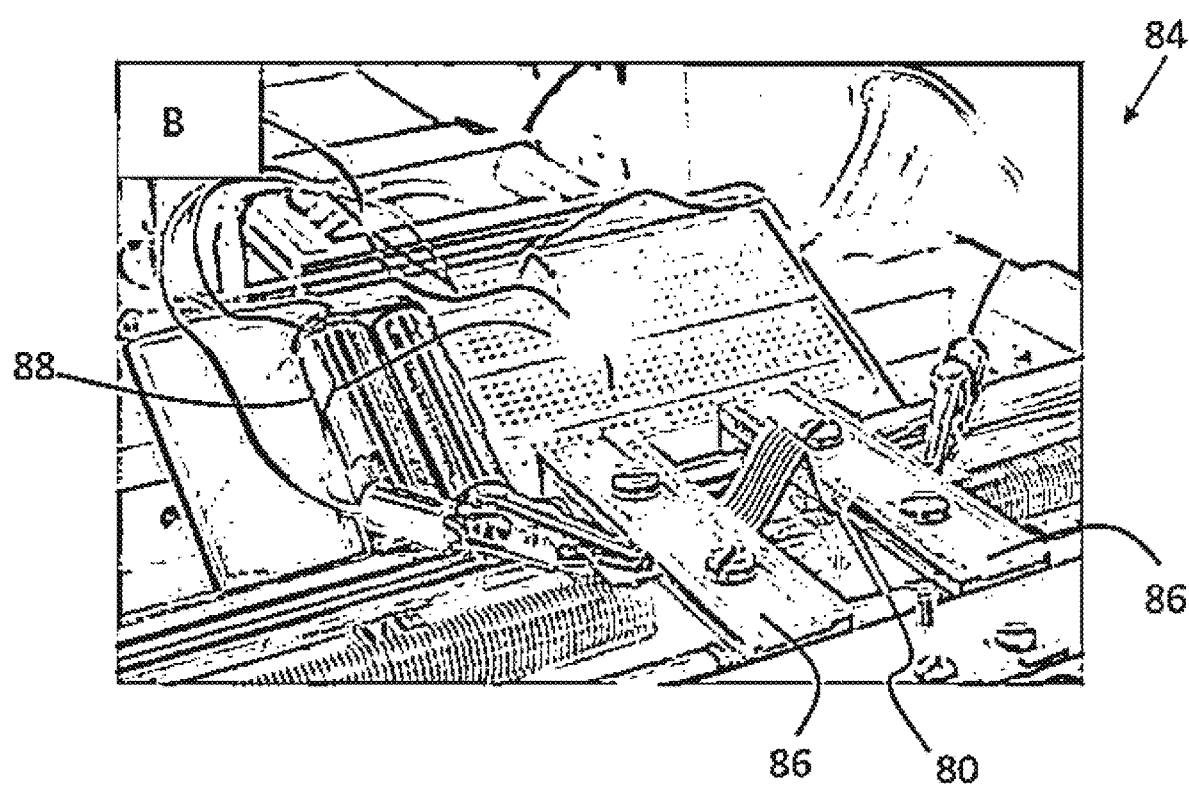
FIG. 8B is an optical image of an LED powered by the copper electrode array of FIG. 7A operating in a bent state.
Figure 9A:
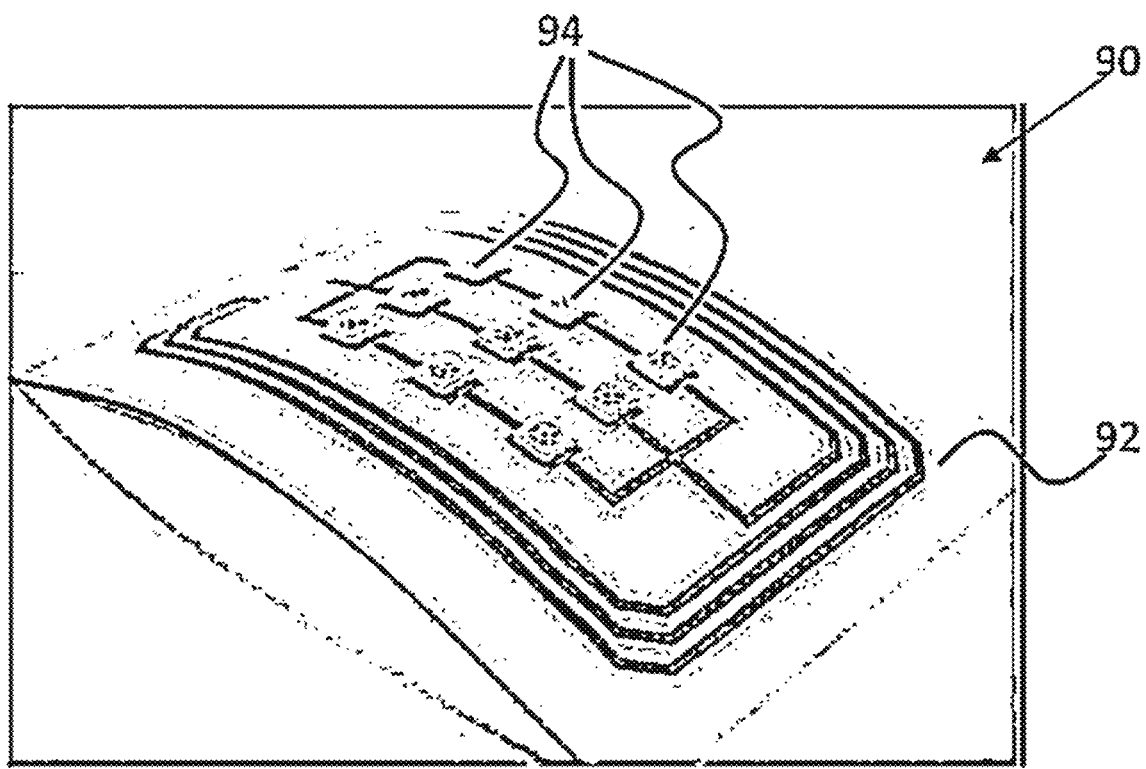
FIG. 9A is an optical image of a battery-free lighting device containing a 3×3 LED array on cellulose paper.
Figure 9B:
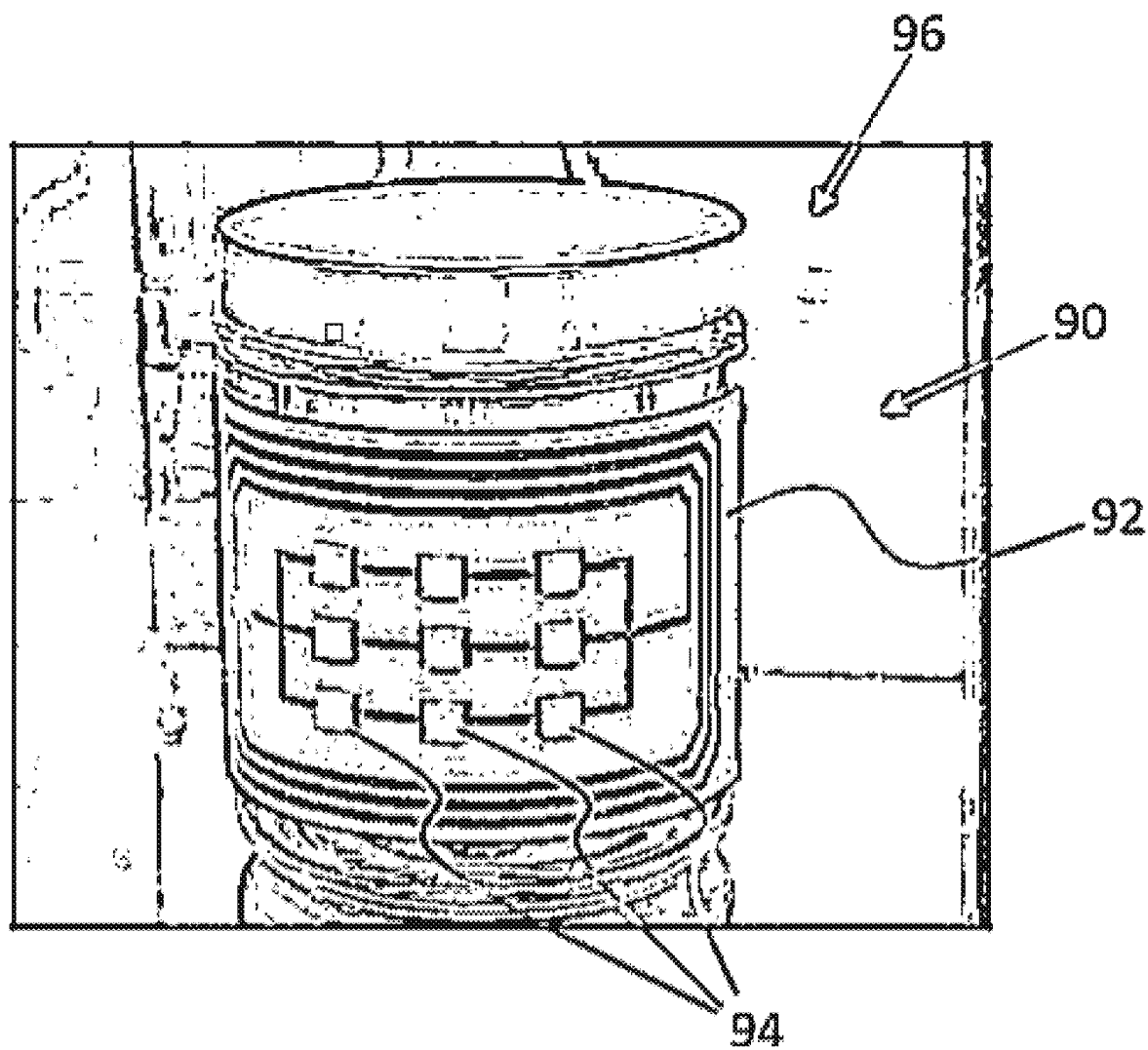

Compared to traditional surface-only conductive features, the bending durability is greatly enhanced by the copper-fiber conductive structure. FIG. 8A and FIG. 8B show how an LED light 88 powered by our copper-cellulose fiber conductive traces 80 remains operational under both normal and bent states. To demonstrate the versatility of the proposed technique in real world applications, a battery-free flexible LED lighting array 90 was produced. A device 90 with a receiving coil 92 operating at 150 kHz was is fabricated using the proposed method to convert RF energy into electrical energy. Nine LEDs 94 with different colors (red, orange, yellow) were then mounted onto the device 90 by 3M z-axis conductive tape as shown in FIG. 9A. As a battery-free device, these LEDs 94 will light up using energy converted by the receiving coil 92. The fabricated device 90 is flexible, lightweight, and can be attached to various surfaces. For example, the device 90 was attached to a glass bottle 96 and placed into a 150-kHz 3D electromagnetic field (EMF) generated by a custom-made device. All LEDs 92 were illuminated and remained fully illuminated when the device 90 was moved or bent, as shown in FIG. 9A. In additional embodiments of this example, the LEDs may be interchanged with other electronic components, such as sensors, displays or actuators, to form a variety of low-cost battery-free devices.

While the proposed method described herein are in conjunction with various embodiments for illustrative purposes, it is not intended that the proposed method be limited to such embodiments. On the contrary, the proposed method described and illustrated herein encompass various alternatives, modifications, and equivalents, without departing from the embodiments, the general scope of which is defined in the appended claims.

Except to the extent necessary or inherent in the processes themselves, no particular order to steps or stages of methods or processes described in this disclosure is intended or implied. In many cases the order of process steps may be varied without changing the purpose, effect, or import of the methods described.

What is claimed is:

1. A method of fabricating metal-fiber conductive structures on a porous substrate, the method comprising the steps of:
   (i) applying a coating compound comprising poly (4-vinylpyridine) (P4VP), Polyvinylpyrrolidone (PVP) and SU-8 dissolved in an organic alcohol solution to one or more surface of the porous substrate;
   (ii) curing the porous substrate at a temperature of at least 130° C. such that the porous substrate is coated with a layer of said coating compound;
   (iii) printing a jet of a transition metal salt catalyst solution onto one or more printing sides of the porous substrate to deposit a transition metal salt catalyst onto the one or more printing sides;
   (iv) submerging the substrate in an electroless metal deposition solution to deposit the metal on the porous substrate, wherein the deposited metal induces the formation of one or more three-dimensional metal-fiber conductive structures within the porous substrate.

2. The method according to claim 1, wherein the step of curing the porous substrate takes place in air.

3. The method according to claim 1, wherein an inkjet printer is used to print the jet of the transition metal salt catalyst solution onto one or more of the printing sides to deposit the transition metal salt catalyst onto the one or more printing sides.

4. The method according to claim 3 wherein one or more printing parameters of said inkjet printer are set to achieve a pre-determined penetration depth of the transition metal salt catalyst solution into the porous substrate.

5. The method according to claim 1, wherein the porous substrate is a substrate comprising cellulose paper, porous polyimide film, porous polyethylene terephthalate film, and textile.

6. The method according to claim 1, wherein the coating compound is applied to the porous substrate by dip-coating said porous substrate in a solution of the coating compound.

7. The method according to claim 1, wherein the concentration of SU-8 in the solution of the coating compound is in a range from 2.5 wt % to 5 wt %.

8. The method according to claim 1, wherein the concentration of P4VP in the solution of the coating compound is in a range from 2.5 wt % to 5 wt %.

9. The method according to claim 7, wherein the solution of the coating compound further comprises 0.2-1.5 mg/mL of polyvinylpyrrolidone (PVP) wherein the polyvinylpyrrolidone enhances the ability of the coating compound to capture nanoparticles of the transition metal salt catalyst.

10. The method according to claim 1, wherein the transition metal salt catalyst in the transition metal salt catalyst solution is one of silver nitrate, palladium chloride and tin chloride.

11. The method according to claim 10, wherein the concentration of transition metal salt in the transition metal salt catalyst solution is in a range from 10 mM to 50 mM.

12. The method according to claim 1, wherein the electroless metal deposition solution is a solution comprising 14 g/L of CuSO4.5H2O, 12 g/L of sodium hydroxide, 16 g/L of potassium sodium tartrate, 20 g/L of EDTA.2Na, 26 mL/L of HCHO, 20 mg/L of 2,2'-dipyridyl, and 10 mg/L potassium ferrocyanide.

13. The method according to claim 4, wherein one or more printing parameters of the inkjet printer for printing a jet of transition metal salt catalyst solution are adjusted to activate a three-dimensional metal salt catalyst-loaded volume at a pre-specified depth below the surface of the porous substrate; and,
   wherein a jetting waveform is used to control the volume and velocity of a plurality of individual droplets within the jet of transition metal salt catalyst solution.

14. The method according to claim 4, wherein the one or more printing parameters include inkjet droplet spacing, meniscus vacuum, printhead temperature, printhead angle and jetting voltage.

15. The method according to claim 1, wherein said substrate is a flexible substrate.

16. The method according to claim 1, wherein the printing a jet of a transition metal-salt catalyst solution onto one or more sides of the coated substrate is performed using an inkjet printer and includes printing a jet of a transition metal-salt catalyst solution on both side of the coated substrate.

17. The method according to claim 16, wherein the jet of transition metal salt catalyst solution printed from the inkjet printer has a droplet spacing in a range from 25 μm to 50 μm.

* * * * *